US012732468B2

(12) United States Patent
Trombley et al.

(10) Patent No.: US 12,732,468 B2
(45) Date of Patent: Sep. 8, 2026

(54) AGGREGATED DATA LINK FLOW CONTROL

(71) Applicant: Microsoft Technology Licensing, LLC, Redmond, WA (US)

(72) Inventors: Michael Raymond Trombley, Cary, NC (US); Simon S. Li, Cupertino, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 84 days.

(21) Appl. No.: 18/755,152

(22) Filed: Jun. 26, 2024

(65) Prior Publication Data

US 2026/0005975 A1 Jan. 1, 2026

(51) Int. Cl.
*G06F 15/16* (2006.01)
*H04L 47/10* (2022.01)
*H10W 90/00* (2026.01)

(52) U.S. Cl.
CPC ............. *H04L 47/39* (2013.01); *H10W 90/00* (2026.01); *H10W 90/722* (2026.01)

(58) Field of Classification Search
CPC ...... H04L 47/39; H10W 90/00; H10W 90/722
USPC ........................................................ 709/238
See application file for complete search history.

(56) References Cited

U.S. PATENT DOCUMENTS 5,036,230 A 7/1991 Bazes
5,790,611 A 8/1998 Huang
7,065,582 B1 * 6/2006 Dwork .................... H04L 47/29 710/52
7,190,667 B2 * 3/2007 Susnow .................. H04L 47/39 370/412
7,236,556 B2 6/2007 Ward
(Continued)

FOREIGN PATENT DOCUMENTS

CN 114978192 A 8/2022
EP 1585247 A2 10/2005
(Continued)

OTHER PUBLICATIONS

International Search Report and Written Opinion received for PCT Application No. PCT/US2025/019084, mailed on Jun. 2, 2025, 12 pages.

(Continued)

*Primary Examiner* — Moustafa M Meky
(74) *Attorney, Agent, or Firm* — Klarquist Sparkman, LLP

(57) ABSTRACT

Systems and methods are disclosed for credit-based flow control of multiple data links using a common reverse channel. The links transfer data from a source to respective buffers at a sink. Credits represent available buffer space. For each data link, a credit counter at the source is decremented as data is transmitted and incremented as the sink returns credits. Reporting logic at the data sink generates a credit report as sink logic retrieves data from the buffer, freeing buffer space. Encoding logic aggregates the credit reports from multiple links for transmission over the common reverse channel to the source, where individual credit reports are extracted and distributed among the links, for update to the respective credit counters. For each link, data transmission pauses when the credit counter decreases to a threshold. Return multiple links' credits over a single reverse channel saves power. Variations are disclosed.

20 Claims, 17 Drawing Sheets

(56) References Cited

U.S. PATENT DOCUMENTS 7,263,066 B1 * 8/2007 Yun .................... H04L 49/106 370/429
7,304,987 B1 * 12/2007 James .................... G06F 8/34 370/429
7,379,422 B2 * 5/2008 Nation .................... H04L 47/266 370/413
7,577,224 B2 8/2009 Eldredge
7,826,371 B2 * 11/2010 Hirayama .................... H04L 47/2433 370/236.1
7,852,757 B1 * 12/2010 Puranik .................... H04L 47/10 710/52
8,711,867 B2 * 4/2014 Guo .................... H04L 45/00 370/413
8,737,228 B2 * 5/2014 DeCusatis .................... H04L 47/39 370/242
9,030,936 B2 * 5/2015 Friedman .................... H04L 47/32 370/413
9,310,830 B2 4/2016 Fiedler
9,485,689 B2 * 11/2016 Farmanbar .................... H04L 47/125
9,729,459 B2 * 8/2017 Hendel .................... H04L 47/30
10,270,834 B2 * 4/2019 Dao .................... H04L 65/752
10,623,326 B2 * 4/2020 Thubert .................... H04L 47/2483
10,904,794 B2 * 1/2021 Farmanbar .................... H04L 47/18
11,239,992 B1 2/2022 Wang
11,818,058 B2 * 11/2023 Das Sharma .................... H04L 49/9005
12,355,670 B2 * 7/2025 Pan .................... H04L 47/129
2002/0196889 A1 12/2002 Tamura
2004/0252804 A1 12/2004 Aoyama
2005/0047538 A1 3/2005 Jaussi
2006/0050639 A1 * 3/2006 Stuart .................... H04L 47/10 370/235
2007/0136620 A1 6/2007 Campbell
2007/0288786 A1 12/2007 Miller
2008/0232179 A1 9/2008 Kwak
2009/0052600 A1 2/2009 Chen
2009/0296867 A1 12/2009 Do
2010/0020818 A1 * 1/2010 Cardona .................... H04L 49/9036 370/463
2011/0068836 A1 3/2011 Wang
2013/0051397 A1 * 2/2013 Guo .................... H04L 45/586 370/400
2013/0083611 A1 4/2013 Ware
2013/0268705 A1 10/2013 Maji et al.
2014/0140206 A1 * 5/2014 Hendel .................... H04L 47/30 370/229
2014/0369194 A1 * 12/2014 Friedman .................... H04L 47/32 370/235
2015/0103668 A1 * 4/2015 Tian .................... H04L 47/30 370/236
2015/0195745 A1 * 7/2015 Farmanbar .................... H04W 24/02 370/236
2016/0112326 A1 * 4/2016 Farmanbar .................... H04W 28/12 370/230.1
2017/0054776 A1 * 2/2017 Dao .................... H04L 65/752
2017/0164240 A1 6/2017 Liang
2018/0013689 A1 1/2018 Miro Panades
2019/0280983 A1 * 9/2019 Thubert .................... H04L 47/283
2019/0354134 A1 11/2019 Cali
2019/0356611 A1 * 11/2019 Das Sharma .................... H04L 49/9005
2020/0099506 A1 3/2020 Goudarzi
2021/0112002 A1 * 4/2021 Pan .................... H04L 45/74
2023/0244293 A1 8/2023 Ware
2024/0056067 A1 2/2024 Wadhwa
2024/0129260 A1 * 4/2024 Farrokhbakht .................... H04L 45/22
2024/0205143 A1 * 6/2024 Farrokhbakht .................... H04L 47/12
2024/0257848 A1 8/2024 Ku
2025/0119384 A1 * 4/2025 Farrokhbakht .................... H04L 49/109
2025/0202834 A1 * 6/2025 Jennings .................... H04L 45/745
2025/0267044 A1 8/2025 Kong
2025/0310076 A1 10/2025 Haiming
2026/0003386 A1 1/2026 Boecker
2026/0003388 A1 1/2026 Shivnaraine
2026/0003390 A1 1/2026 Shivnaraine

FOREIGN PATENT DOCUMENTS

EP 3053315 B1 11/2017
JP 2009200917 A 9/2009

OTHER PUBLICATIONS

International Search Report and Written Opinion received for PCT Application No. PCT/US2025/020790, mailed on Jun. 13, 2025, 14 pages.
International Search Report and Written Opinion received for PCT Application No. PCT/US2025/019262, Jun. 25, 2025, 12 pages.
International Search Report and Written Opinion received for PCT Application No. PCT/US2025/019263 mailed on Jun. 12, 2025, 13 pages.
Non-Final Office Action mailed on Aug. 21, 2025, in U.S. Appl. No. 18/755,098, 9 pages.
Non-Final Office Action mailed on Aug. 21, 2025, in U.S. Appl. No. 18/755,115, 10 pages.
Notice of Allowance mailed on Dec. 23, 2025, in U.S. Appl. No. 18/755,115, 08 Pages.
Notice of Allowance mailed on Mar. 2, 2026, in U.S. Appl. No. 18/755,098, 08 Pages.
Non-Final Office Action mailed on Apr. 1, 2026, in U.S. Appl. No. 18/755,129, 14 Pages.
Notice of Allowance mailed on Apr. 10, 2026, in U.S. Appl. No. 18/755,115, 09 Pages.

* cited by examiner

705 Source Logic
Stage 1
715 Tx Interface
Stage 2
725 Tx Link Macro
735 Interposer
745 Rx Link Macro
755 Rx Interface
765 Sink Logic
txD1[139:0]
txV1
txPClk1
txD2[139:0]
txV2
txPClk2
txSClk2
txD3[13:0]
txSClk3
rxD4[13:0]
rxSClk4
rxD5[139:0]
rxPClk5
rxD6[139:0]
rxPClk6
Stage 3
Stage 4
Stage 5
Stage 6
710
760
711B
712B
713B
714B
D0
D1
D2
D3
714A
711A
712A
713A
720
750
766
771
761
768
773
763
721
722
723
724
756
758
751
753
744
771
773
741
742
734
731
732
743
730
736
733
738
700

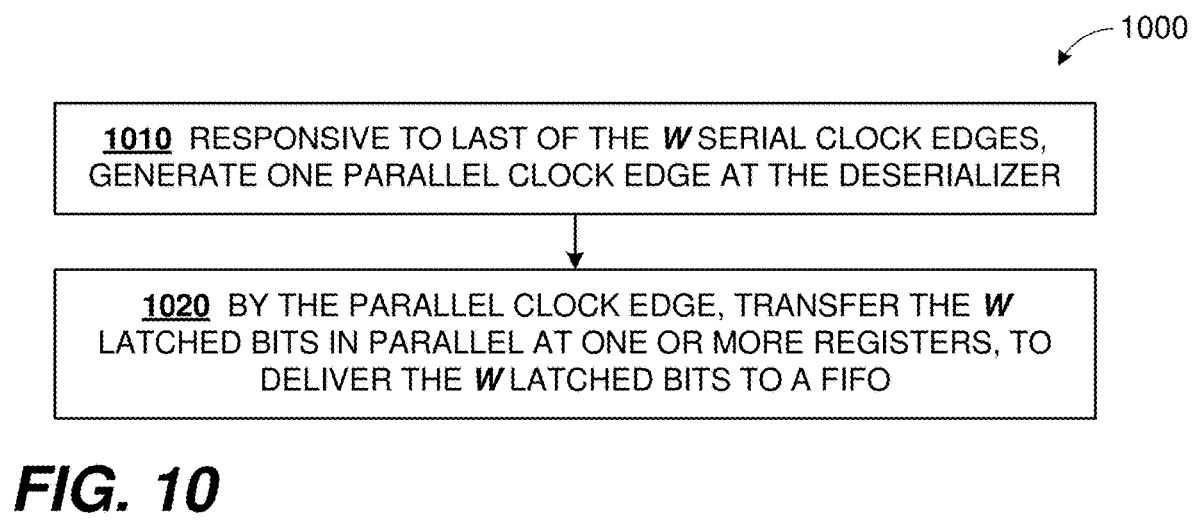

1000

1010 RESPONSIVE TO LAST OF THE *W* SERIAL CLOCK EDGES, GENERATE ONE PARALLEL CLOCK EDGE AT THE DESERIALIZER

1020 BY THE PARALLEL CLOCK EDGE, TRANSFER THE *W* LATCHED BITS IN PARALLEL AT ONE OR MORE REGISTERS, TO DELIVER THE *W* LATCHED BITS TO A FIFO

*FIG. 10*

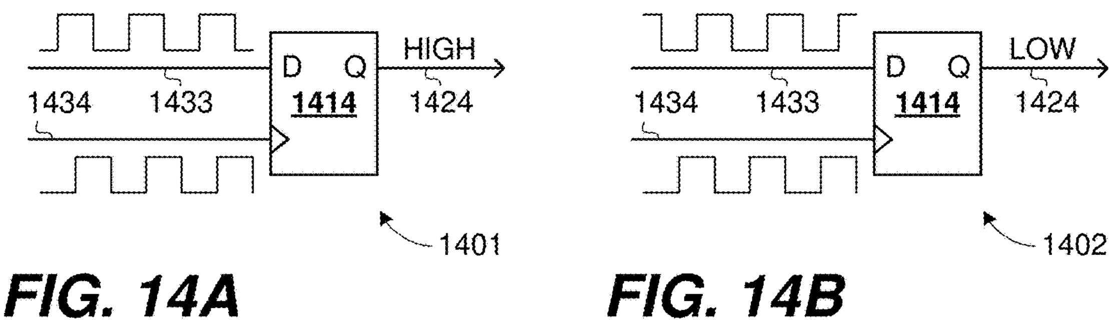
FIG. 14A
FIG. 14B
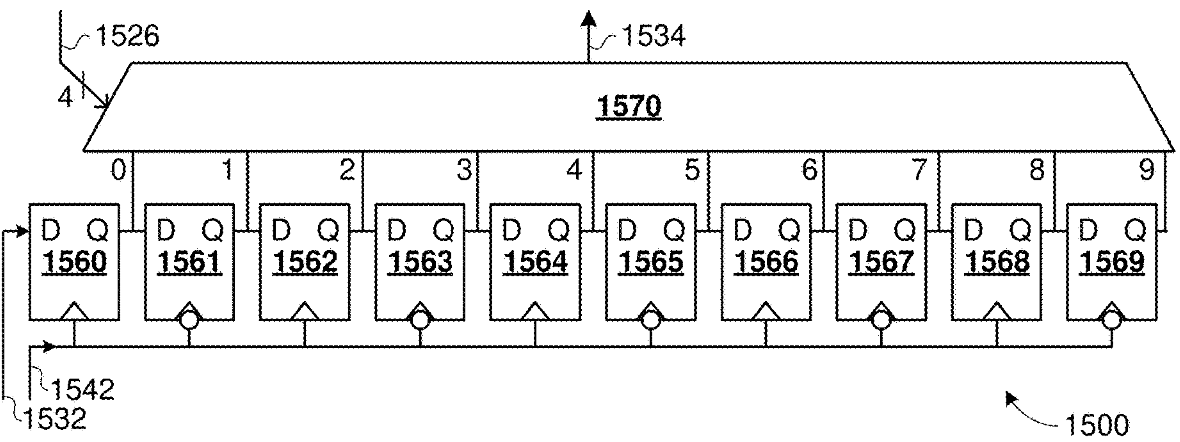
FIG. 15
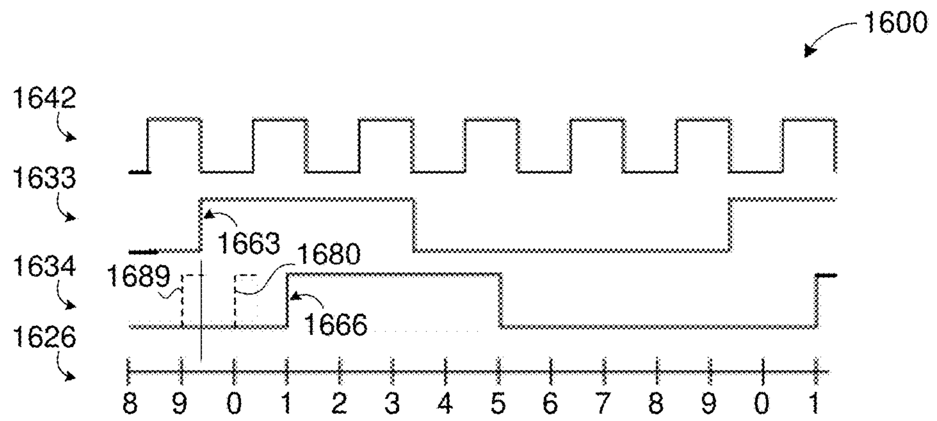
FIG. 16

1700

1800

1810 PERFORM COARSE ADJUSTMENT OF *PH*

1820 APPLY SUCCESSIVE FINE ADJUSTMENTS TO *PH* UNTIL, AT *PH2*, THE MONITORED PHASE RELATIONSHIP SATISFIES THE PREDETERMINED CRITERION

1830 SET *PH* BASED ON *PH2*

1900

1910 PERFORM ADJUSTMENT OF *PH*

1920 LATCH PARALLEL DATA BASED ON *CLK2*

1930 SERIALIZE LATCHED DATA

1930 TRANSMIT SERIALIZED DATA

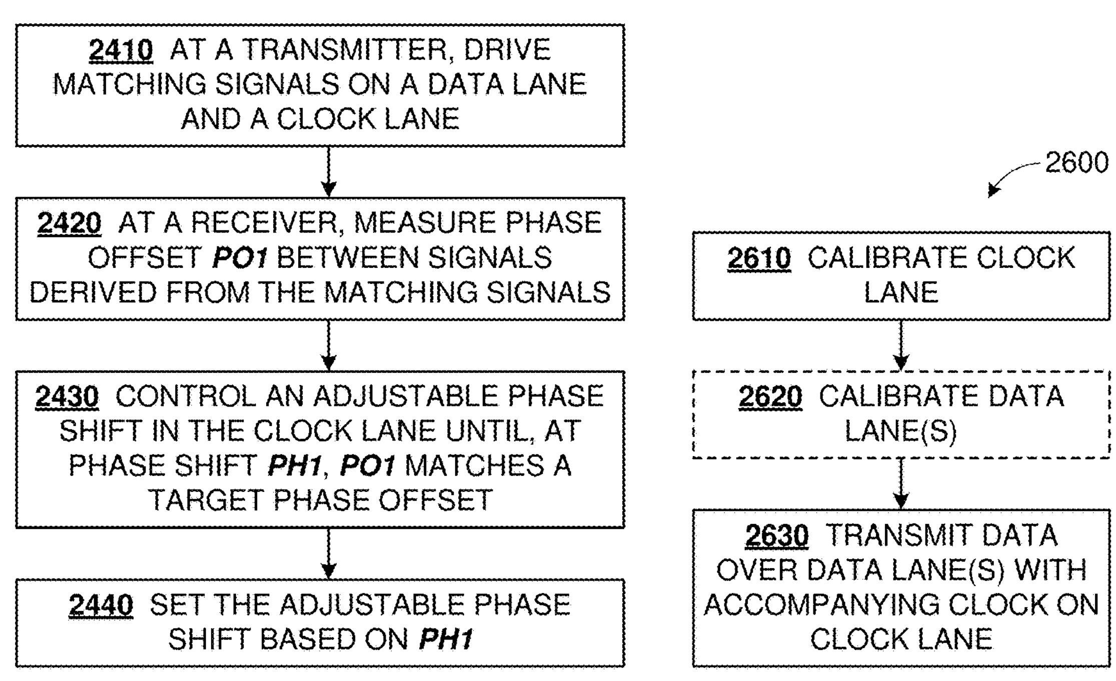
FIG. 24
FIG. 26
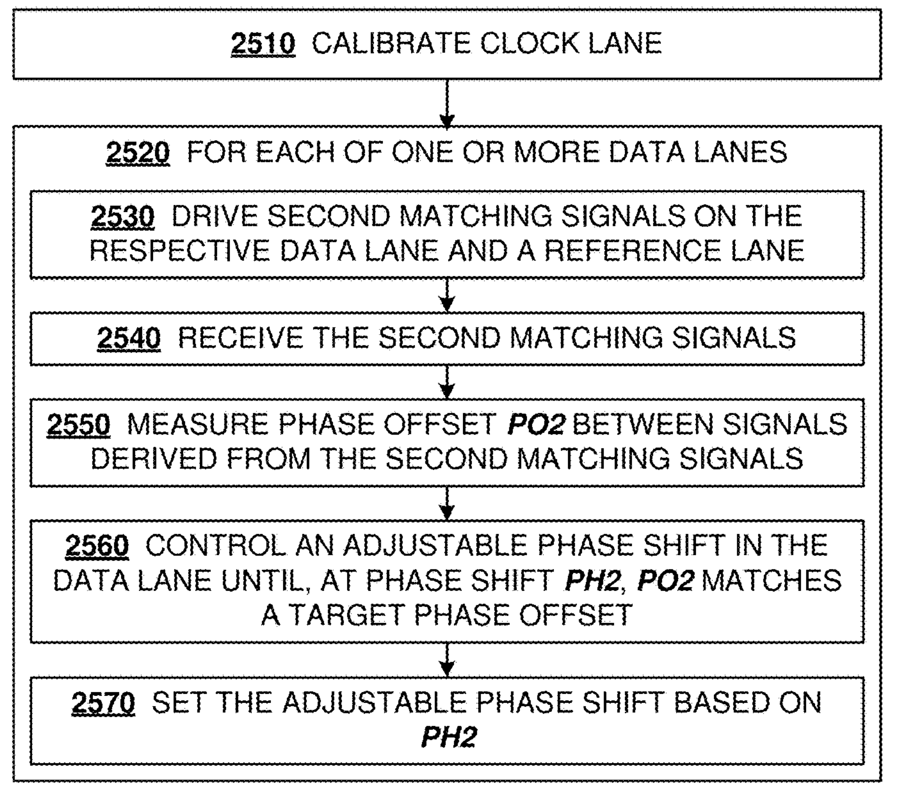
FIG. 25

Figure 29:
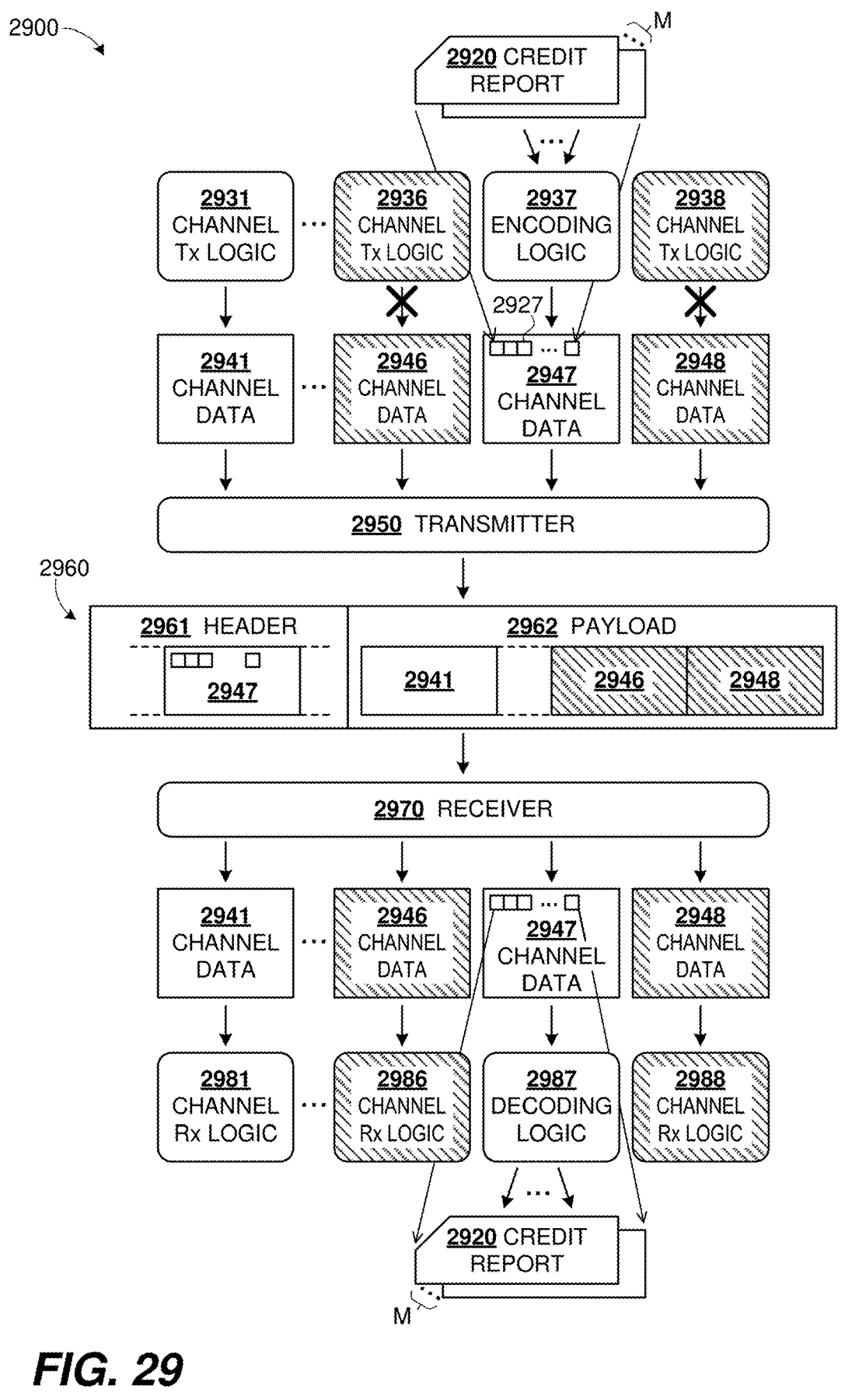

2900

M

2920 CREDIT REPORT

2931 CHANNEL Tx LOGIC

2936 CHANNEL Tx LOGIC

2937 ENCODING LOGIC

2938 CHANNEL Tx LOGIC

2927

2941 CHANNEL DATA

2946 CHANNEL DATA

2947 CHANNEL DATA

2948 CHANNEL DATA

2950 TRANSMITTER

2960

2961 HEADER

2947

2962 PAYLOAD

2941

2946

2948

2970 RECEIVER

2941 CHANNEL DATA

2946 CHANNEL DATA

2947 CHANNEL DATA

2948 CHANNEL DATA

2981 CHANNEL Rx LOGIC

2986 CHANNEL Rx LOGIC

2987 DECODING LOGIC

2988 CHANNEL Rx LOGIC

2920 CREDIT REPORT

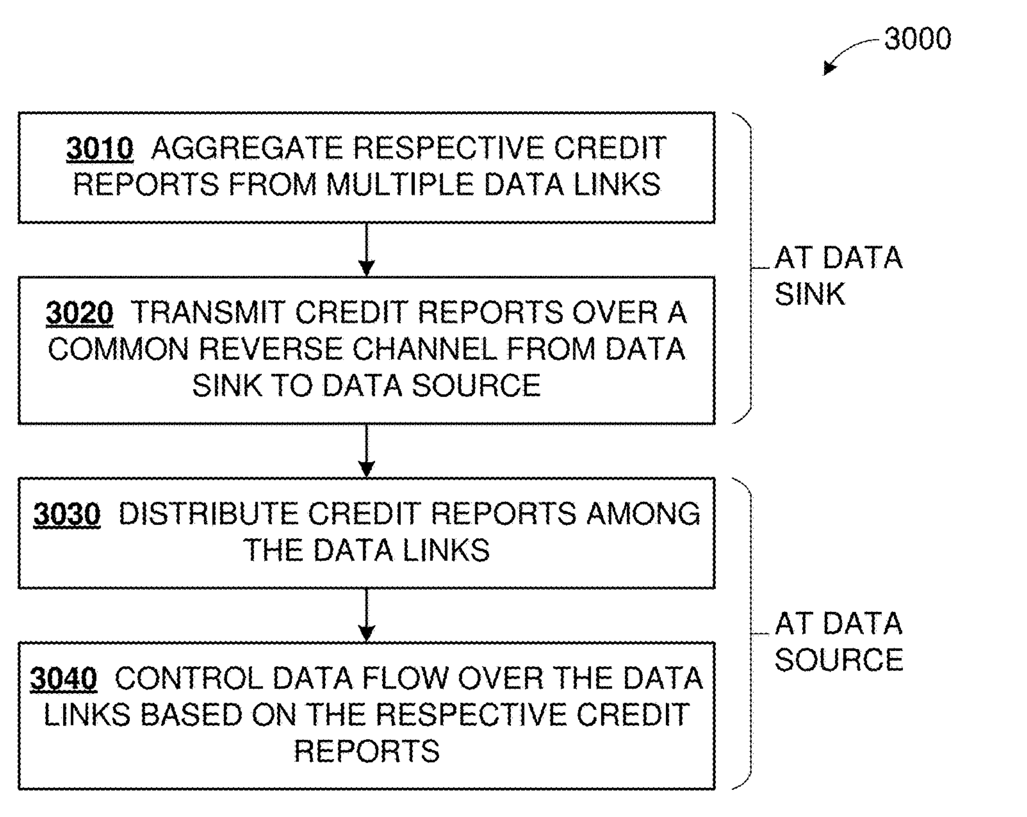
FIG. 30
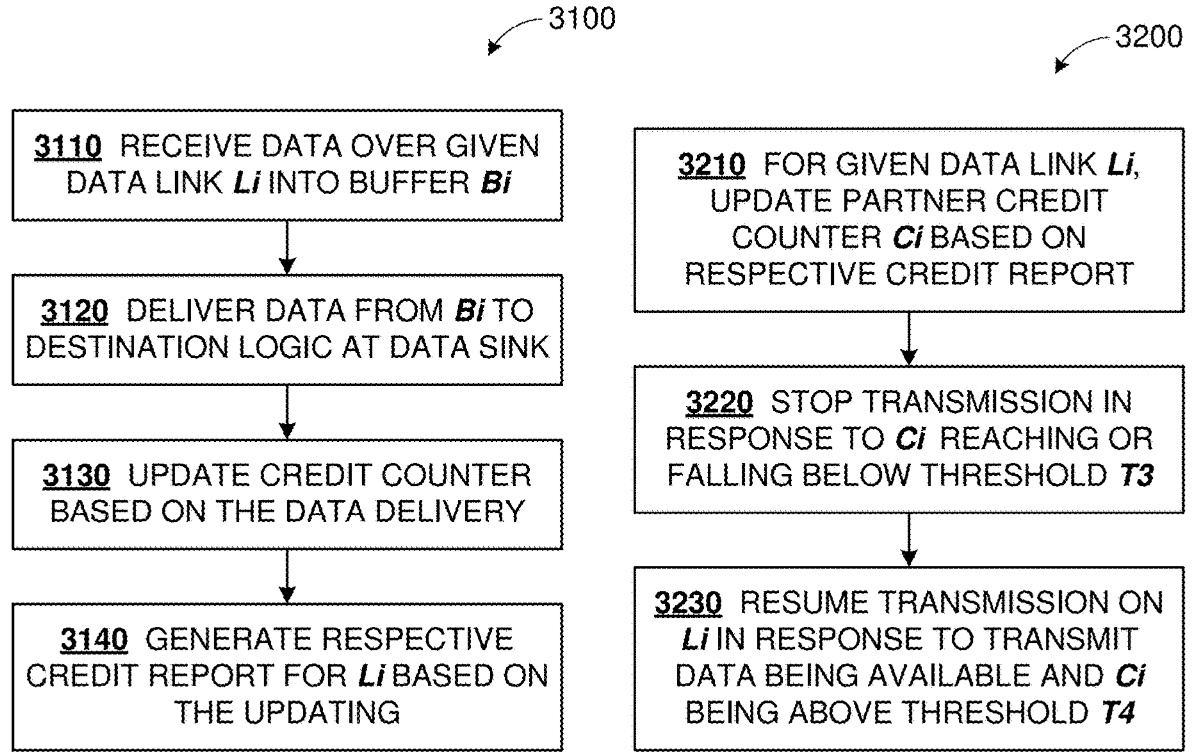
FIG. 31
FIG. 32

AGGREGATED DATA LINK FLOW CONTROL

FIELD

This application relates generally to digital data communication.

BACKGROUND

Despite continued advancement in very large scale integration (VLSI) technology, some high performance computing (HPC) applications can require substantially greater processing power than is achievable on a single die. High bandwidth data communication between dice, whether in a single package or not, can consume significant power. Accordingly, there remains a need for improved technologies for digital data communication between circuits.

SUMMARY

In brief, disclosed technologies provide credit-based flow control of multiple data links using a common reverse channel. The data links can deliver content data from a common data source into respective buffers at a common data sink, and sink logic can extract data from the buffers. Because data delivery and data extraction at a buffer can be asynchronous, buffer occupancy can vary. Credits can be used to represent available buffer space: each buffer can have an associated credit count indicating how many buffer locations are available at any time. In order to notify the data source of credits freed up by data extraction, some disclosed examples implement credit reporting logic for each data link. The reporting logic can be coupled to the buffer and configured to output a credit report to encoding logic in the common reverse channel. The encoding logic can aggregate such credit reports from multiple data links and transmit aggregated reports through the reverse channel to decoding logic at the data sink, where credit reports for the individual data links can be extracted and distributed among the data links. Tracking logic at the data source can update a partner credit counter based on the credit report. The data source can control data flow based on the partner credit counter.

The foregoing and other objects, features, and advantages of the invention will become more apparent from the following detailed description, which proceeds with reference to the accompanying figures.

BRIEF DESCRIPTION OF THE DRAWINGS

FIGS. 9-10 are flowcharts of example extensions to the method of FIG. 8.

FIGS. 12A-12B are diagrams illustrating a second example short cycle data link in a fourth system according to the disclosed technologies.

FIGS. 14A-14B are diagrams illustrating operation of a phase detector which can be used in some examples of the disclosed technologies.

FIG. 15 is a diagram illustrating a phase controller which can be used in some examples of the disclosed technologies.

FIG. 16 is a timing diagram illustrating a first example calibration according to the disclosed technologies.

FIG. 24 is a flowchart of a third example method according to the disclosed technologies.

FIGS. 25-26 are flowcharts of example extensions to the method of FIG. 24.

FIG. 29 is a diagram illustrating example signaling in a common reverse channel according to the disclosed technologies.

FIG. 30 is a flowchart of a fourth example method according to the disclosed technologies.

FIGS. 31-32 are flowcharts of example extensions to the method of FIG. 30.

DETAILED DESCRIPTION

Introduction and Overview

Figure 1:
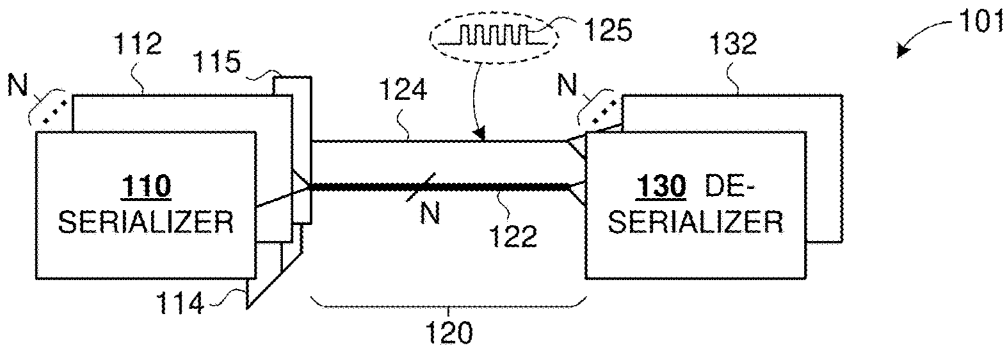
FIG. 1 is a diagram of a first example system implementing a multi-lane data link according to the disclosed technologies.

The size of neural network models used in so-called artificial intelligence ("AI") applications has been growing at a rapid pace: some well-known AI applications have over 1 trillion parameters. The computational resources required to implement such models with practical response time far exceeds the capacity of a single die, and clustering of processors has been the norm. In a hierarchical architecture, dice can be clustered within an integrated circuit ("IC") package, integrated circuit packages can be clustered on a board, boards can be clustered in a computer chassis, and multiple computer chassis can be networked in a data center or in the cloud. At successive levels of clustering, interconnect distances, circuit loading, and transmission line pitch progressively increase, resulting in data transfers that rely on fewer data lanes, have higher latency, and consume more power. Accordingly, it can be desirable to maximize clustering at the lowest level-dice within an IC package-so as to reduce performance penalties incurred by clustering at higher levels. However, even within an IC package, die-to-die communication can consume 15-20% of the total power consumption of an AI tool.

The technologies disclosed herein provide several innovations which can reduce die-to-die power consumption for AI tools. These innovations can also be applied at other levels of clustering, and for other high-performance computing ("HPC") applications. Thus, while some aspects of this disclosure describe dice for clarity, it can be understood that such description can also be applied to data links between other sources and sinks of data.

Traffic between dice can be bursty, and it can be desirable to minimize power consumption when a data link is idle. In a first aspect, some examples of the disclosed technologies employ clock-forwarded data link signaling so that every active data cycle is accompanied by its own clock edge. This allows the clock to be shut off when the data link is idle, saving power. In turn, the clock signal can inform a receiver whether the data link is idle or active, thereby eliminating the need for a separate valid signal and saving space.

To maximize power savings, it is desirable to have exactly W serial clock edges to transmit W bits from a data source and latch those bits at a data sink. This can raise timing issues at both ends of the data link. Logic at the data source can implement a deep and wide parallel clock tree with relatively broad timing spreads on the order of 100-500 ps. In contrast, high speed serial link operation can be achieved with a shallow and narrow serial clock tree having timing spreads of 1-10 ps. In a second aspect, some examples of the disclosed technologies employ source-side clock calibration to compensate for source logic parallel clock spread, allowing serializer logic to reliably latch parallel data from the source logic without extra clock cycles for synchronization. Such calibration allows zero-cycle entry into a high-speed data link in a manner compatible with standard circuit design flows for the source logic.

At the data sink, there can be two parallel clock domains: one derived from the data source via the serial clock forwarded on the data link, and another main clock for sink logic. A buffer such as a FIFO can be implemented to interface between these clock domains. Thus, deserializer output can be forwarded to and stored in the FIFO, and retrieved by the sink logic according to the main clock. In a third aspect, some examples of the disclosed technologies employ clock forwarding between deserializer and FIFO, whereby a single serially transmitted word leads to a single parallel clock edge which clocks a parallel word out of the deserializer. The same parallel clock edge can accompany the parallel word across one or more registers, causing the parallel word to be latched at those registers, until the parallel word reaches and is stored in the FIFO. Thus, zero-cycle exit from the data link can also be achieved.

As a variation and in a fourth aspect, half-cycle or single-cycle entry or exit can be implemented, for more conservative designs with less stringent timing constraints. Such examples may transmit extra clock cycles across the data link, and may also transmit a valid signal to distinguish clock cycle having valid data from the extra clock cycles (which are not accompanied by valid data). As an illustration, a data link can have a utilization of 1-out-of-M parallel clock cycles for which a zero-cycle implementation can transmit a serial clock for just those 1-out-of-M parallel clock cycles, while a half-cycle or single-cycle implementation can require 2-out-of-M serial clock transmissions to generate at least one additional parallel clock cycle at the data sink. Thus, while not as economical as a zero-cycle implementation, a half-cycle or single-cycle implementation can still provide significant power saving for a low duty cycle data link.

There can also be timing variation between various lanes of a data link, due e.g. to variations in propagation delay. In a fifth aspect, some examples of the disclosed technologies employ a clock-to-data or data-to-data calibration at the data sink to align two received lanes. By transmitting matching signals on the two lanes, a phase difference can be measured. Then, the phase of one signal can be adjusted using phase interpolation or another technique to bring the two lanes into a desired alignment. In some examples, calibration between a serial clock lane and a representative data lane can be used to implement a coarse calibration on the serial clock lane, and calibration between the serial clock lane and remaining data lanes can be used to implement fine calibration on the data lanes. Calibration of received timing can optimize signal-to-noise ratio, enabling high data transfer rates with low power levels.

To efficiently support high data throughputs, some innovative data links deliver data to a buffer at the data sink, from which sink logic can retrieve and process the delivered data. At high transfer rates, multiple words can be in flight between source and sink at a given instant, and it can be desirable to implement flow control signaling on a reverse link to alert the data source e.g. that the buffer is nearly full. In a sixth aspect, some examples of the disclosed technologies can consolidate the flow control signals of multiple forward data links into a single logical or physical reverse channel. Thereby, power for multiple physical reverse channels can be saved.

These and other aspects of the disclosed technologies will become more clear from the description below.

Terminology

The following explanations of terms are provided to facilitate review of the various embodiments. Explanations extend to related word forms. Occasionally, and where clear from the context, a term may also be used in a different meaning.

The term "aggregate" refers to combining data (such as credit reports) from multiple sources (such as data link receiver modules) into a single data object or data stream. In some examples, a single data object can contain multiple credit reports of respective data links, but this is not a requirement. In other examples, a single data stream can sequentially convey the multiple credit reports, e.g. in a sequence of data frames.

A "buffer" is a device that receives data or another signal and outputs a copy of that data or signal. Some buffers such as followers or inverters can be memoryless, while other buffers such as flip-flops or registers can store data prior to output. A single "flip-flop" can store one binary bit; a "register" can be an array of flip-flops which can store a word. A "shift register" can store multiple bits in series, and a first-in first-out buffer ("FIFO") can store multiple words in series. The terms "latch" and (in context of buffers) "transfer" refer to an act of storing data presented at a buffer's input(s). The "drive strength" of a buffer or other circuit device is a measure of the peak output current magnitude of that buffer or device during an output transition.

A "bus" is an electrical pathway providing a facility for data transfer between two circuit modules. A bus can include one or more conductive paths (sometimes "wires") for data signals, control signals, or address signals. The wires of a bus can be organized as "lanes," each lane supporting transfer of one data bit or one other signal at any instant of time. A "serial bus" carries all bits of a word in a single data lane and can transfer one bit at a time, but can have one or more other lanes for control signals such as clock or valid. A parallel bus distributes W bits of a word across W distinct data lanes, whereby multiple data bits can be transferred simultaneously. In some examples, very wide words can be treated as aggregates of narrower words, each of which can be transferred over its own parallel or serial bus. To illustrate, a 140-bit word can be treated as 14 10-bit words, each of which can be serialized on a respective serial bus and the entire 140-bit word can be transferred over 14 serial data lanes. Because bits of each 10-bit word are transmitted serially, the group of serial lanes is not a parallel bus. The number of data lanes in a bus can be termed the "width" of the bus. Commonly, a lane can be implemented using one wire (e.g. for single-ended signals) or two wires (e.g. for differential or current loop signals). A lane can carry multiple logical channels. In variations, each wire can be an optical communication channel, with multiple wires of an optical bus separated by physical diversity or wavelength diversity.

A "channel" is a facility for transferring a stream of data from a source to a sink. The channel can be dedicated to its stream of data. A channel can be a physical channel or a logical channel. A "physical channel" has its own transmitter(s), receiver(s) and transmission bus not shared with any other data stream. A "logical channel" shares a transmitter, a receiver, and/or a transmission bus with at least one other logical channel. Sharing can be static or dynamic. Some logical channels can occupy pre-assigned (static) fields in a container data structure. Other logical channels can be time-multiplexed over a common transmission bus with dynamic assignment of the bus among the sharing logical channels.

A "client" is a hardware or software computing entity that uses a resource provided by another hardware or software computing entity. Examples of clients include logic coupled to an innovative data link, or software transmitting or receiving data over an innovative data link.

A "clock" is a signal having transitions between two states termed "high" and "low." Thus, clock transitions can be of two types: low→high or high→low. In some examples only one type of transition (commonly low→high) are significant while, in other examples, both types of transitions can be significant. Such examples are termed "single-rate" and "double-rate" clocks respectively. The significant transitions are dubbed "edges" and the interval between successive edges is dubbed a "cycle." Data or control signals accompanying a clock can have a respective state for each cycle, although the precise timing of data changes can be offset from the accompanying clock edges. To illustrate, a clock edge can trigger data transfer at a gate. The clock edge can be applied at least a setup time after the data is applied at a gate input, and the gate output can change state after a gate propagation delay. In examples, a clock can be incorporated into a bus to demarcate cycles of the accompanying data lanes. A "serial clock" is the clock accompanying a serial bus and a "parallel clock" is the clock accompanying a parallel bus.

A "comparator" is a device whose output indicates a state of a binary relationship between two input signals. Some comparators disclosed herein can output a logic High if a first input signal has a higher value than a second signal and a logic Low if the first signal has a lower value. Other comparators can be "phase comparators," outputting a logic High if the first signal leads the second signal or a logic Low if the first signal lags. Some comparators disclosed herein can be implemented in hardware, e.g. in circuitry having a specific comparison function, but this is not a requirement, and other comparators can be implemented in firmware or software.

A "computer" is an apparatus implemented on one or more integrated circuits and operable to decode and execute a predetermined sequence of program instructions. Further examples of computers are described herein, e.g. in context of FIG. 33.

A "credit" is a representation of space available in a buffer receiving data over a data link. Credits can decrease as data is transmitted into the buffer, and can increase as data is extracted from the buffer. A counter ("credit counter") can be used to store total available credits or changes in credits. Because of latencies in data transmission and a credit return path (from data sink to data source), values of a credit counter can deviate from the actual space available in the buffer or actual changes in such space. A "credit report" is a data item or message indicating credits or changes in credits. A credit report can be returned from a data sink to a data source to update or maintain a credit counter at the data source.

The unqualified term "data" refers to any digital representation of information, and can include content transferred across an innovative data link. A "bit" of data is an atomic piece of data. While bits are often binary, e.g. having one of two values 0|1, high|low, True|False, this is not a requirement and bits encoding three or more states can also be used. Bits can be transmitted serially, e.g. in a single lane, between a serializer and a deserializer. The serializer and deserializer can interface with other logic over parallel buses, in which multiple bits are transmitted simultaneously over respective conductive wires. A "word" is a parallel arrangement of bits.

A "data link" is an apparatus for transmitting content data from a device producing the content data (dubbed "data source") to a device consuming the content data (dubbed "data sink"). A data link can include a transmitter module at the data source, a receiver module at the data sink, and a transmission bus from the transmitter to the receiver. A data link can have one or more physical channels, e.g. over respective data lanes, and can also include auxiliary lanes for clock, valid, or other signals. In some cases, a data link can be a physical channel, dedicated to a particular stream of content data. In other cases, a data link can support multiple streams of data. A data link can include one or more logical channels, or a mix of physical and logical channels.

A "die" is a block of a semiconducting material having an electronic circuit fabricated thereon. One or more dice can be attached to a support (e.g. a lead frame or substrate) having external electrical contacts (e.g. wire leads or solder bumps) and enclosed to form an integrated circuit package. Some examples of the disclosed technology can be applied between two dice in a single integrated circuit package, in which case an internal connecting device dubbed an "interposer" can be used to connect the dice within the integrated circuit package. In examples, the interposer can be a passive planar circuit board placed beneath the dice and above the support member, but this is not a requirement and other configurations can also be used.

A "driver" is a circuit coupled to a lane of a bus and configured to apply signals (e.g. voltages or currents representing data bits or other signals) to the bus lane. As counterpart to a driver, a "receiver" is a circuit coupled to a lane and configured to detect the signals on the bus lane.

A "field" is an atomic data item storing a single value, which is a value of a particular parameter. Some fields of interest herein can store a value of a credit counter, or an identifier of a data link.

A "filter" is a device that produces an output signal from an input signal, with non-uniform gain or phase shift across components of the input signal. Some filters of interest herein are low-pass filters which attenuate high-frequency components relative to low-frequency components to provide averaging. Commonly, a filter can be linear over its specified range of input amplitudes, such that halving amplitudes of any input signal components halves the amplitudes of corresponding components of the output signal. Some filters disclosed herein can be implemented in hardware, e.g. in analog circuitry having a specific filtering function, but this is not a requirement, and other filters can be implemented in digital circuitry, firmware, or software.

The term "flow control" refers to management of a data link so that the data sink is not overrun with data and data is not lost. Some disclosed examples implement credit-based flow control. Data transmission can be paused or stopped when no credits, or insufficient credits, are available. Data transmission can be resumed or started when credits, or sufficient credits, are available. The combination of pausing and resuming is sometimes termed "throttling."

"Idle" refers to a state of a bus lane not supporting data transfer or having low power draw. Any lane of a bus can be in an idle state, e.g. when data is not being transferred over the bus. In some examples, a driver of an idle lane can have a high output impedance, allowing the voltage(s) of the idle lane to be determined by e.g. pull-up, pull-down, or parasitic resistors. In other examples, an idle lane can be driven to a predetermined state (e.g. high or low). In further examples, an idle lane can be maintained in its previous state.

An "integrated circuit" (or "integrated circuit package") is a set of one or more electronic circuit modules, on one or more semiconductor dice, assembled in a single enclosed package, which can be further integrated with other integrated circuits or electrical components, e.g. on a printed circuit board.

As a noun, "logic" refers to electronic circuitry performing one or more functions on or with digital signals. Disclosed innovative data links can incorporate logic at a data source (e.g. for a serializer, clock driver, or other associated functionality) and at a data sink (e.g. for a deserializer, clock regenerator, or other associated functionality). Additional logic at the data source can generated data traffic to be transferred over one or more innovative datalinks. Additional logic at the data sink can receive and process such transferred data traffic. Logic can include "hard" modules (sometimes, "hard macros") in which a layout of gates and interconnect is fixed, or "soft" modules (sometimes, "soft IP" or "soft intellectual property") in which circuitry is defined at a behavioral level, and can also include programmable circuitry. As a qualifier or adjective, "logic" refers to properties of digital signals, e.g. logic Low or logic High.

The term "matching signals" refers to two signals having a same shape with multiple transitions over respective durations. While the durations can be the same, this is not a requirement, and two matching signals can have a temporal offset. Furthermore, due to variations in propagation delay, the temporal offset between two matching signals can evolve over the signals' propagation paths. In other contexts, two quantities (or entities) are considered to "match" if they are equal (or identical) to within a predetermined tolerance (or variation).

A "mode" refers to a particular configuration of data link circuitry or signals. Data links can transfer data produced by source logic for consumption at sink logic in an "operation mode" (sometimes, "normal mode"). Such data is dubbed "content data." In a "calibration mode," adjustments (e.g. of phase) can be made. Generally, calibration mode can require transmission of specialized signals over the data link, or temporary operation of data link circuitry with indeterminate or invalid characteristics (e.g. timing). Accordingly, transfer of content data can be avoided during calibration mode. Conversely, phase or other adjustments can be avoided during operation mode.

A "neural network" is an artificial network of "units" (or "cells") that has linkages modeled on behavior of biological neurons and can be implemented by one or more electronic circuit modules, either hard-wired or as software executed on a processor. The units of a neural network can be organized in a graph of layers, such that output of one layer provides input to one or more other layers.

The term "periodic" refers to a time-dependent signal (sometimes, "waveform") that repeats after a fixed time dubbed its "period." Thus, a periodic signal extends for at least two periods, but need not extend indefinitely. Some periodic signals, such as clocks, can be digital signals having exactly one High interval and one Low interval in each period, often with 50% duty cycle, but these are not requirements of a periodic signal.

The "phase" of a signal refers its temporal offset relative to a reference. The "phase offset" between two signals is the phase of one signal relative to the other as the reference. The reference can be the same signal at a different position in a circuit, another signal on which the instant signal is dependent, or another signal which may or may not be physically present in the circuit. A "phase relationship" can characterize a phase offset as one among a discrete set of values (e.g. lagging, leading, or aligned), or as an amount of phase offset measured in units of time, angle (one period being 360°), or fractions of a clock period or clock cycle. For example, a serial clock cycle can define a unit interval ("UI") and phase offset can be measured in UI. A "phase detector" is a device producing an output which depends on the phase of an input. A phase detector can receive the reference as a second input. Some phase detectors can be implemented as phase comparators. A "phase shifter" (or "phase tuner") is a device applying a temporal offset to an output signal relative to an input signal. Some phase shifters can apply an adjustable temporal offset based on a control input. Some adjustable phase shifters can incorporate tapped delay lines (e.g. using chains of buffers or flip-flops) or tunable analog delays (e.g. using resistive, inductive, or capacitive components). Other adjustable phase shifters can be phase interpolators incorporating variable drive strength buffers as described herein. "Progressive" phase adjustment refers to monotonic adjustment of phase in increments less than half a cycle of an associated clock.

A "serializer" is a circuit that receives parallel data and transmits corresponding serial data. A "deserializer" is a circuit that receives serial data and transmits corresponding parallel data. In examples, serializers and deserializers can perform other functions such as retiming data, regenerating a clock, interpreting or generating a valid signal, or encoding or decoding data.

A "signal" is a physical representation of information conveyed from a source to a destination. Common signals described herein are electrical voltages transmitted over conductive wires, but this is not a requirement and other forms of signals can also be used. Common signals described herein convey control information or content information from source to destination—the content information being data desired to be communicated from source to destination and the control information (e.g. clock or valid signals) assisting with detection or interpretation of the data content at the destination.

"Software" refers to computer-executable programs, instructions (sometimes "program instructions"), or associated data structures. Software can be in active or quiescent states. In an active state, software can be loaded into memory, or can be undergoing execution by one or more processors. In a quiescent state, software can be stored on computer-readable media, awaiting transmission or execution.

The terms "transmit" and "receive" refer to communication between circuits, e.g. over a bus. The communication can be electromagnetic, e.g. over conductive wires.

In some contexts, the term "valid" refers to a signal accompanying one or more data lanes, the state of the valid signal indicating whether the data lanes are carrying data traffic. That is, a data lane may not be continuously active, but can transfer data content periodically or intermittently. An "ON" valid signal can indicate active data transfer, while an "OFF" valid signal can indicate that the data lane is idle or can be ignored. A valid signal can change state from one clock cycle to another, and the state of the valid signal can enable a recipient to determine whether bits present on associated data lanes represent a data transfer. In other contexts, the term "valid" qualifies data (e.g. bits on a data lane) that is part of a data transfer, which can be accompanied by a valid signal in an ON state. However, the presence of a valid signal is not a requirement. In some disclosed examples, the valid signal can be omitted, and validity of data lanes can be inferred from an accompanying clock signal.

An "XOR gate" is a digital circuit receiving two inputs and producing an output that indicates whether the two inputs have same or different logic states. Thus, an XOR gate can perform either an exclusive OR function or an exclusive NOR function.

First Example System

FIG. 1 is a diagram of a first example system implementing a multi-lane data link 101. In this system, N serializers 110 . . . 112 are coupled to corresponding N deserializers 130 . . . 132 over N data lanes 122 of serial bus 120. Bus 120 also includes clock lane 124, over which serial clock 125 can be driven by clock driver 115. Serial clock 125 can be delivered to each of deserializers 130 . . . 132. Serial clock 125 can also be delivered to serializers 110 . . . 112 as shown by connections 114.

Each serializer 110 can drive data bits serially on its respective data lane. In particular, each serializer 110 can receive a parallel data word (not shown), based on which serializer 110 can drive W bits of data on W successive edges of serial clock 125. Each deserializer 130 can receive data bits serially on its respective data lane, and can latch the W bits driven by corresponding serializer 110 on the W edges of serial clock 125. Illustrative signals are described in context of FIG. 7.

Notably, the same W edges of the serial clock can be used to drive the data bits at serializers 110 and to latch the data bits at deserializer 130. This can be accomplished by having a greater propagation delay for the serial clock, from serializer 110 to deserializer 130, than for the corresponding data lane. To illustrate, a passive or active delay can be inserted in clock lane 124 or individually at deserializers 130 . . . 132.

Numerous variations and extensions can be implemented within scope of the disclosed technologies. As shown in FIG. 1, bus 120 has data lanes 122 and clock lane 124, but no lane for a valid signal. As described further herein, validity of data on lanes 122 can be indicated solely by the W successive edges of the serial clock transmitted on clock lane 124. Serial clock 125 can be a single-rate clock or a double-rate clock. In further examples, deserializer 130 or a separate circuit module can also reconstitute a parallel clock, according to which deserializer 130 can drive an output data word. The W bits driven by serializer can be identical to W bits received in a parallel data word, but this is not a requirement. In other examples, the parallel data word can be encoded to obtain the W serial bits transmitted from serializer to deserializer. Examples of encoding include augmentation with a parity bit or other error code for error detection or error correction; or 8 b/10 b encoding to mitigate disparity. The number N of serializers, deserializers, and data lanes can be 1, 2, 4, 8, 12, 14, 16, or in a range 2-5, 6-10, 11-20, 21-50, or 51-100, or more than 100. The number W of serial bits can be 2, 4, 8, 16, 24, 32, or in a range 2-7, 8-15, 16-31, 32-63, 64-127, 128-255, 256-512, 513-1024 or more than 1024.

Example Integrated Circuit Package

Figure 2:
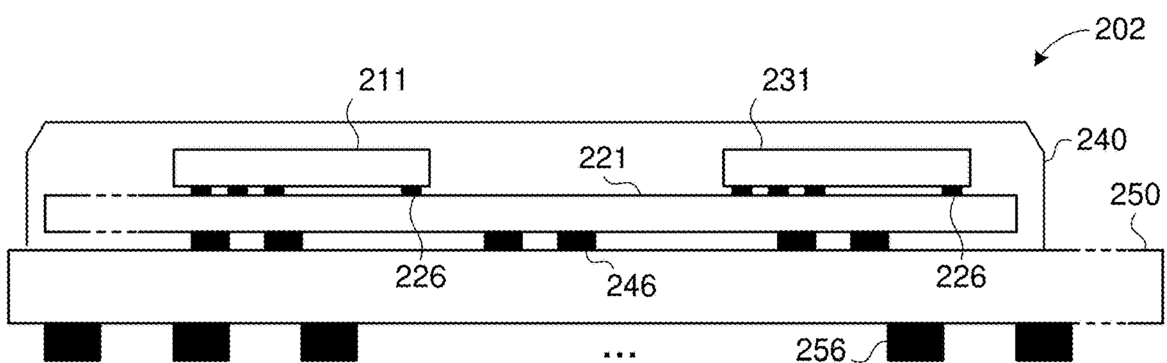
FIG. 2 is a diagram of an example integrated circuit package according to the disclosed technologies.

FIG. 2 is a diagram of an example integrated circuit package 202 in which the disclosed technologies can be implemented. Dice 211, 231 can be supported by interposer 221. Serializers 110 . . . 112 and clock driver 115 can be implemented on die 211, and deserializers 130 . . . 132 can be implemented on die 231. Serial bus 120 can extend from driving circuits on die 211, via interposer 221, to deserializers on die 231.

Interposer 221 in turn can be supported by package substrate 250. Encapsulation 240 can protect circuitry on dice 211, 231. Three tiers of bump contacts are shown. Fine-pitch contacts 226 connect circuits on dice 211, 231 to interposer 221. Intermediate-pitch contacts 246 connect wiring on interposer 221 to substrate 250, and coarse-pitch contacts 256 are available to mount package 202 onto a printed circuit board, e.g. in a computer. In examples, bumps 226 can have diameter 10-50 μm, or about 25 μm and a pitch 20-100 μm, or about 40 μm. Bumps 246 can have diameter 50-200 μm, or about 80 μm and a pitch 80-400 μm, or about 130 μm.

Numerous variations and extensions can be implemented within scope of the disclosed technologies. Dice 211, 231 and interposer 221 can support multiple instances of data link 101 of FIG. 1, each with its own clock lane, serializers, and deserializers. Particularly, each instance "i" of data link 101 can have its respective number N=Ni of data lanes, its respective number W=Wi of serial data bits per parallel data word, and a respective direction of data transfer. The values of these parameters can be same or different among various data link instances. In particular, first and second data links 101 can be coupled in opposite directions between dice 211, 231. Thus, first data link 101 can have serializer(s) on die 211 and deserializer(s) on die 231, and second data link 101 can have serializer(s) on die 231 and deserializer(s) on die 211. Designs with hundreds of data links can achieve aggregated data transfer rates of terabytes per second between two dice.

Example Computer

Figure 3:
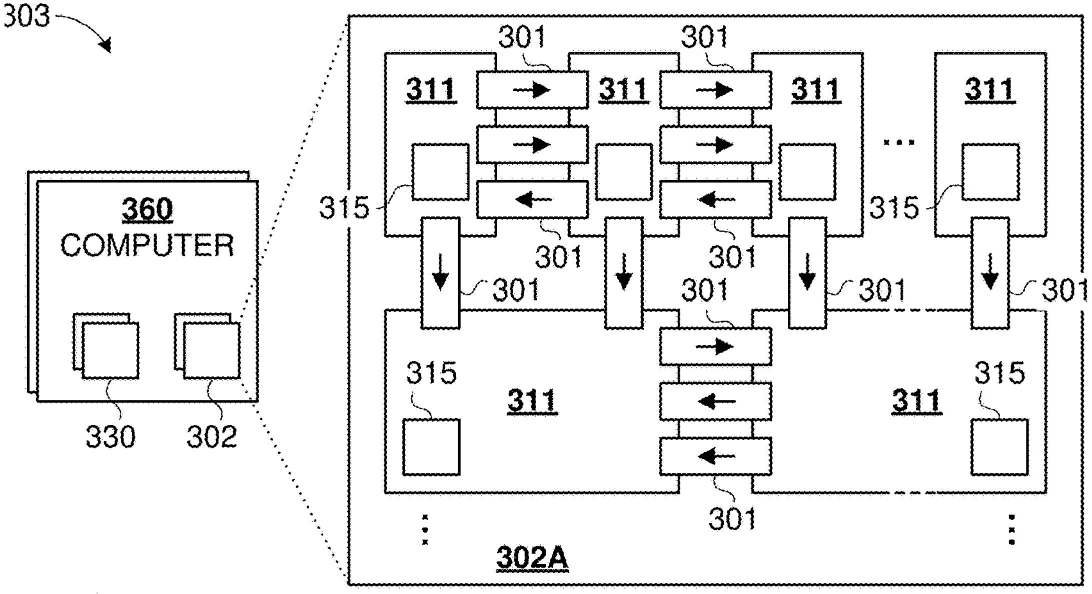
FIG. 3 is a diagram of an example computer incorporating disclosed technologies.

FIG. 3 is a diagram 303 of an example computer implementing innovative data links according to the disclosed technologies. Computer 360 is shown incorporating one or more integrated circuit packages 302, which can be similar to package 202 of FIG. 2. One package 302A is shown in more detail in an inset. Package 302A incorporates an array of dice 311, each of which can be similar to dice 211, 221 of FIG. 2. Dice 311 can be interconnected by various data links 301, which can be similar to data link 101 of FIG. 1. Illustrated links 301 can be configured to transfer data in directions shown by respective arrows. Links 301 can have same or different clock or data parameters, in any combination. Also shown in FIG. 3 is additional logic 315 on each die 311, which can perform processing to generate data to be transferred to another die 311 by a link 301, or which can perform processing on data received over link(s) 301. Links 301 can connect dice 311 through one or more interposers similar to 221 of FIG. 2, which are not expressly shown in FIG. 3.

Figure 33:
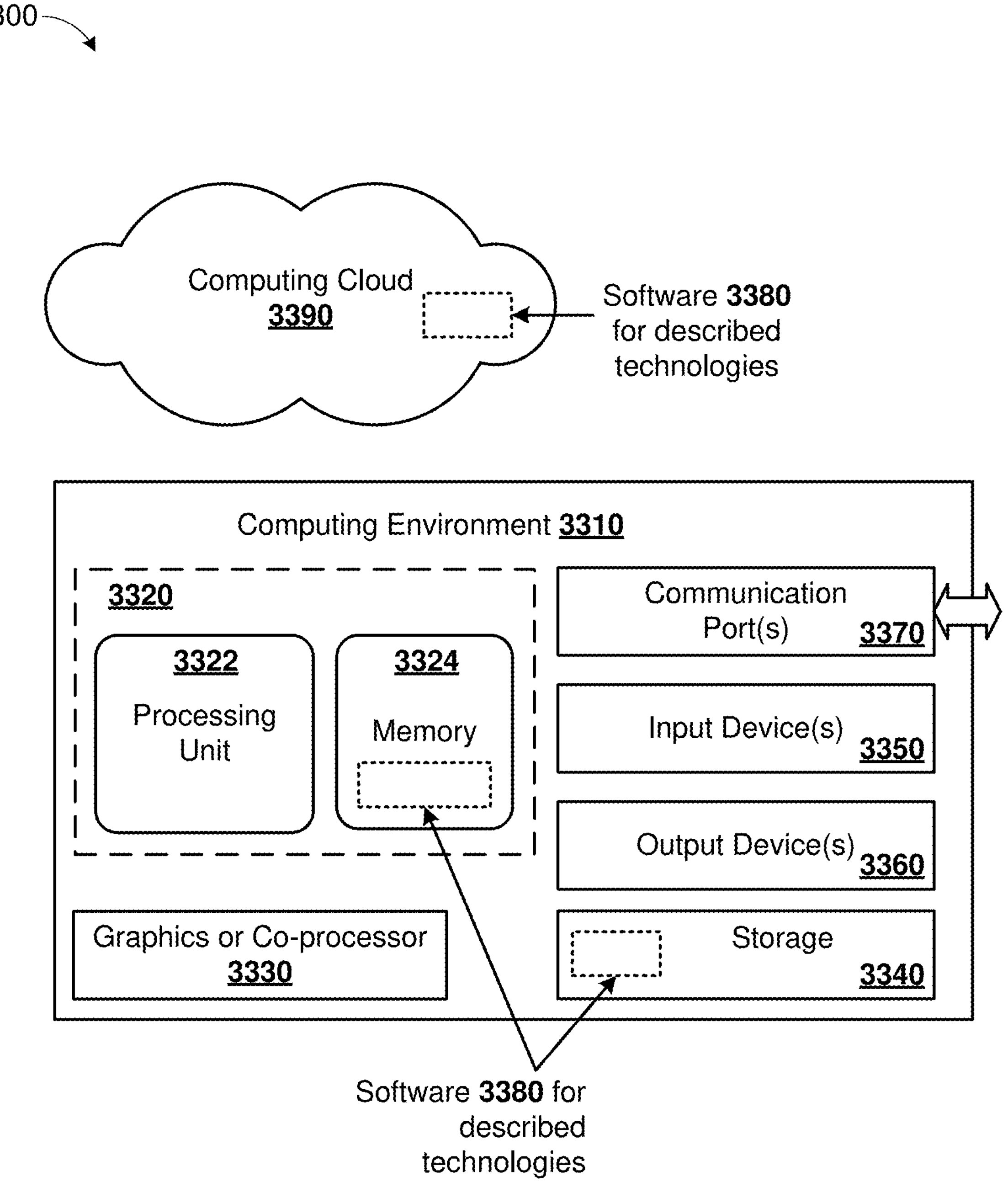
FIG. 33 is a diagram schematically depicting a computing environment suitable for implementation of disclosed technologies.

Additional possible components of computer 360 are described further herein, e.g. in context of FIG. 33. In particular, computer 360 can incorporate one or more memories 330 storing program instructions which, when executed by computer 360, can result in data being transferred from one die 311 to another die 311 over an innovative data link 301. In examples, the program instructions can implement a neural network and the transferred data can represent internal signals flowing between units of the neural network. Multiple computers 360, as shown, can be coupled together to form a compute cluster. Computers 360 can be implemented in a data center or in the cloud.

Second Example System

Figures 4, 5A, 5B, 6:
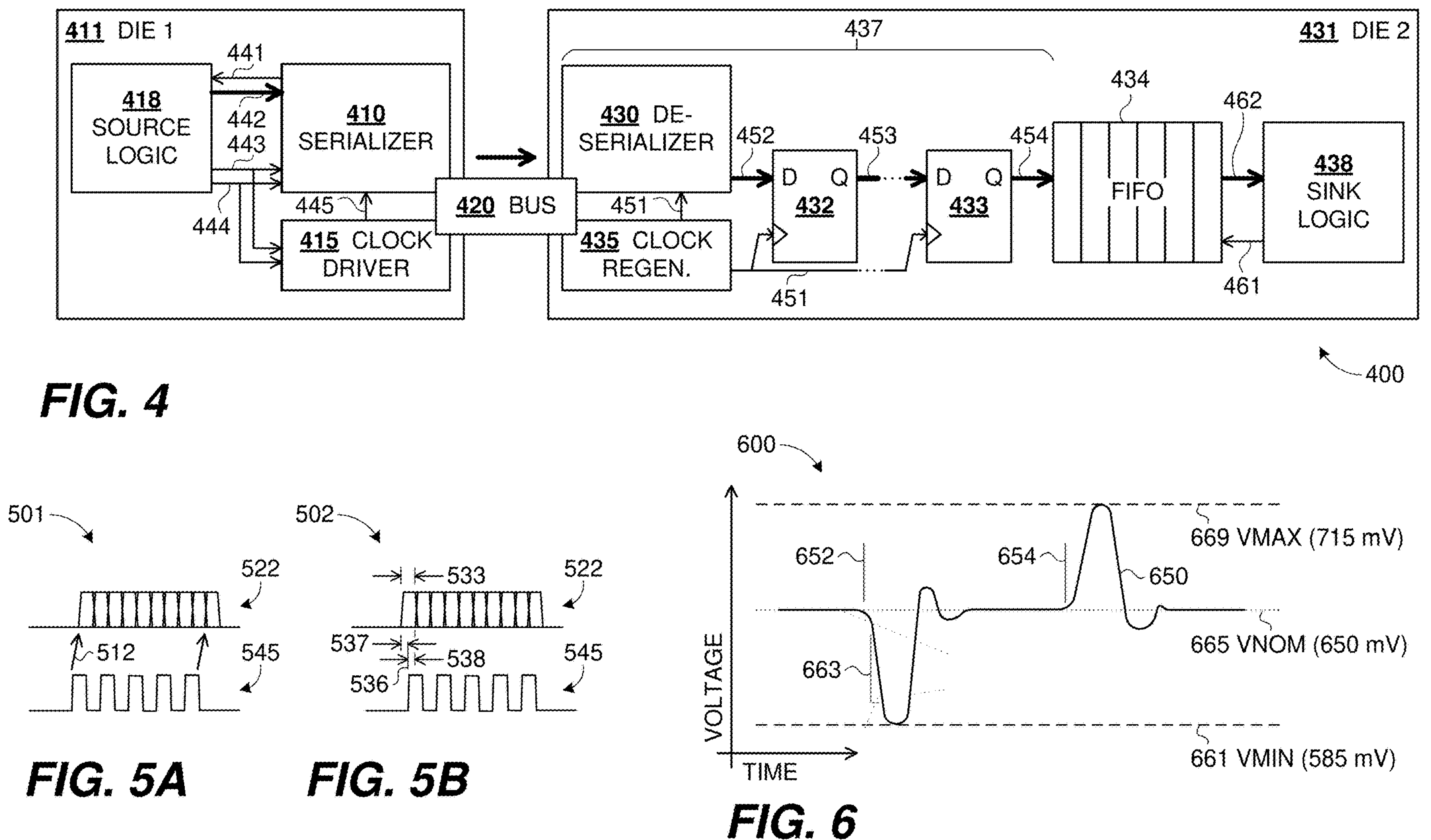
FIG. 4 is a diagram of a second example system implementing a die-to-die data link according to the disclosed technologies.
FIGS. 5A-5B constitute a diagram illustrating a timing concept used in examples of the disclosed technologies.
FIG. 6 is a chart illustrating timing challenges encountered in examples of the disclosed technologies.

FIG. 4 is a diagram 400 of a second example system implementing a die-to-die data link. In this system, serializer 410 transfers data over bus 420 to deserializer 430, enabling source logic 418 on die 411 to transfer data to sink logic 438 on die 431.

Serializer 410 can provide Ready signal 441 to source logic 418, responsive to which source logic 418 can drive parallel data words 442 and Valid signal 443 on respective cycles of parallel clock 444. Parallel clock 444 and Valid signal 443 can also be provided to clock driver 415, which can generate a serial clock to be driven over bus 420. Serial clock 445 can also be provided to serializer 410 for clocking out successive serial bits over bus 420. Accordingly, bus 420 can convey serial data on a data lane and a serial clock on a clock lane from die 411 to die 431. Serializer 410, clock driver 415, and bus 420 can be similar to 110, 115, 120 of FIG. 1. In examples with a single serializer 410, clock driver 415 can be integrated with serializer 410. In examples with multiple serializers, a single clock driver 415 suffices to drive a single clock lane common to multiple data lanes driven by respective serializers 410. Illustrative signals are described in context of FIG. 7.

At die 431, clock regenerator 435 can receive the serial clock over bus 420 and can regenerate parallel clock 451. Deserializer 430 can receive serial clock and serial data from respective lanes of bus 420, and can output parallel words 452 (identical or similar to source words 442 on die 411) on respective cycles of parallel clock 451.

On die 431, parallel clock 451 can have a clock domain 437 extending from deserializer 430 to FIFO 434. FIFO 434 can provide an elastic buffer, and data 462 can be clocked out from FIFO 434 to sink logic 438 on a clock 461 which is independent of parallel clock 451.

Within clock domain 437, one or more registers 432-433 in series can buffer data 452-454 en route to FIFO 434, with first register 432 receiving parallel data directly from deserializer 430 and last register 433 storing parallel data 454 in FIFO 434. In some examples, the same edges of parallel clock 451 can be used to drive parallel data 452 out from deserializer 430 and to transfer data at each of downstream registers 432-433, thereby implementing an efficient zero cycle exit path on die 431.

In other examples, a half-cycle, one cycle, or other delay can be implemented between (i) the clock edge driving data 452 from deserializer 430 and (ii) the clock edge transferring data 452 to data 453 at register 432, or between any successive pairs of registers 432-433. Thereby, short cycle exit paths can be implemented, for conservative designs. Short cycle paths are described further in context of FIGS. 11A-11B or elsewhere herein.

FIGS. 5A-5B are diagrams 501, 502 illustrating relative timing between serial clock 545 and serial data 522 at both ends of an innovative data link. At the data source (e.g. die 411, serializer 410), serial clock 545 can drive serialized output bits 522, so that data 522 is delayed relative to clock 545 by a propagation delay of a driving gate, as indicated by arrow 512. At the data sink (e.g. die 431, deserializer 430), clock 545 can be delayed relative to data 522 so that clock edge 536 meets setup time and hold time of a receiving gate, as indicated by markers 537, 538 respectively. Thereby, the same edges of clock 545 which were used to drive bits 522 at the data source can be used to latch bits 522 at the data sink. This can be achieved by introducing additional delay in the transmission path of clock 554 relative to the transmission path of data 522, as described herein. Clock edge 536 can latch data 522 in serial data cycle 533.

Similar considerations and techniques can be applied between successive parallel registers 430, 432-433 to achieve zero-cycle exit from a data link. That is, a clock edge driving data at a launching register (similar to arrow 541 of FIG. 5A can be delayed and used to latch data at a destination register (similar to edge 536 of FIG. 5B).

Example Interaction of Voltage Noise and Timing

FIG. 6 is a chart 600 illustrating some timing challenges in modern circuits. Supply voltage on a circuit can vary due to load changes. To save power, circuit blocks can often be clock gated. Clock gating can be used to stop transitions on a clock line, which can also stop other logic transitions dependent on that clock line. Significant power savings can be achieved at a clock-gated module. However, from another perspective, clock gating can lead to sudden increases in load current when the clock is gated ON and sudden decreases in load current when the clock is gated OFF. The sudden changes in load current can cause spikes, ripple, or other forms of noise on the supply voltage.

Graph 650 shows supply voltage variation with time as the clock of a circuit module is gated ON at time 652 and gated OFF at time 654. For a nominal supply voltage 665 VNOM=650 mV, 10% voltage swings (±65 mV) can be seen before voltage regulation can take effect. Voltage slew rate 663 can be around 10 mV/ns. Thus, the 65 mV voltage droop at time 652 from VNOM 665 to VMIN 661 can take about 6 ns. During this time, signal B lagging signal A can pass through a gate with lower supply voltage and hence longer propagation delay than signal A, leading to an amplification of the skew between signals A and B. Under such conditions, skew can grow about 10%. Thus, a design having 100 ps skew between signals A and B under constant supply voltage can have an additional±10 ps skew variation due to voltage noise, making tight timing and high clock rates difficult to achieve.

To overcome this challenge, disclosed examples can be designed with very tight timing, often in a range 2-10 ps for a circuit with (serial) clock frequencies in a range 5-20 GHz or about 12 GHz, corresponding to clock cycles of 50-200 ps for a single-rate clock, or 25-100 ps for a double-rate clock. To illustrate, a 4 ps skew between signals A and B can experience 10% skew amplification, e.g. ±0.4 ps. This much additional skew variation can be tolerated within a 25 ps serial clock cycle, e.g. meeting timing constraints and achieving reliable sampling of a serial data stream at a deserializer. To achieve such low skews, hard macros can be used (and re-used) in serializers 410 or deserializers 430. Disclosed calibrations at transmitter and receiver can also enable meeting tight timing under 10 ps.

There can be a tradeoff between signal skew and filter capacitance on the power supply. To illustrate, doubling the capacitance can reduce power supply slew rate 663 to about 5 mV/ns and can also reduce supply voltage variation to +5%. Skew amplification can also drop in similar proportion. However, filter capacitance can be limited by practical considerations of available space proximate to the gated circuit modules.

Example Timing Diagram

Figure 7:
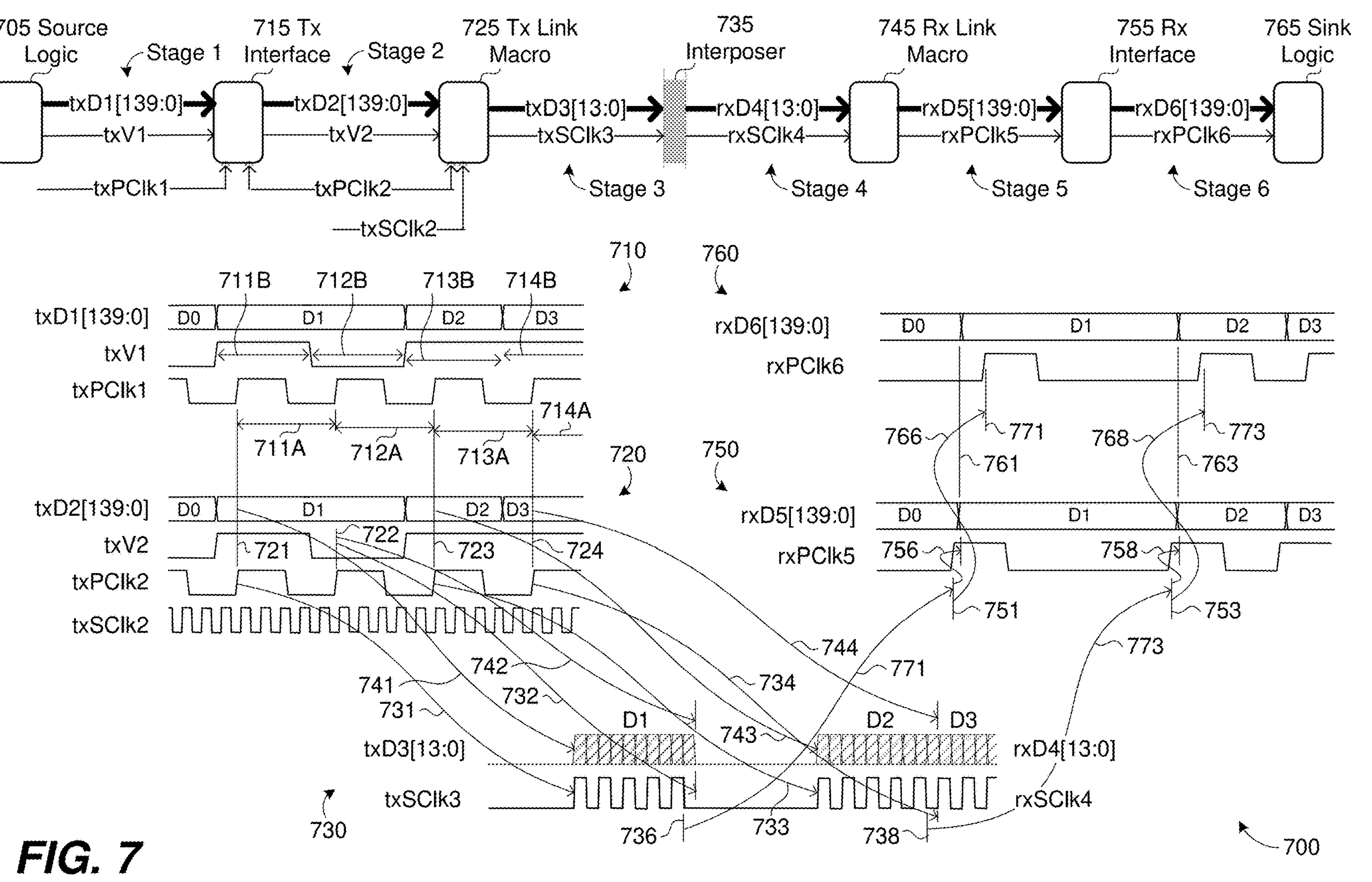
FIG. 7 is a timing diagram illustrating signal propagation in an example of the disclosed technologies.

FIG. 7 is a timing diagram 700 illustrating signal propagation through an innovative data link. The illustrated path follows data from source logic 705 at a data source (e.g. on a die similar to 211 of FIG. 2 or 411 of FIG. 4) to sink logic 765 at a data sink (e.g. on a die similar to 231 or 431). In this illustration, the heart of the innovative data link lies in a pair of circuit modules 725, 745, which can be hard macros, joined by interposer 735. Interface circuits 715, 755 couple link macros 725, 745 to source and sink logic 705, 765 respectively, and Rx interface 755 can enable zero cycle operation downstream of the data link. In this description, signals and components upstream of interposer 735 are designated “tx” or “Tx” for transmit side of the data link, while signals and components downstream of interposer 735 are designated “rx” or “Rx” for receive side of the data link. Data and control signals have numbers 1 . . . 6 in their names according to stages 1 . . . 6 of the illustrated path. Certain clock signals can be generated by a clock generator module (not shown) at the data source or a clock regenerator (not shown) at the data sink. Features of the illustrated signals are applicable to some embodiments described in context of FIGS. 1-4.

Initially, at stage 1, source logic 705 can drive 140 bit data bus txD1[139:0] to Tx Interface 715, accompanied by valid signal txV1 and parallel clock txPClk1. Timing of these signals is shown in diagram 710. Four cycles 711A-714A of clock txPClk1 are marked, corresponding to cycles 711B-714B of valid signal txV1 and data txD1[ ]. In this illustration, cycles 711A-714A of clock txPClk1 lag cycles 711B-714B of txV1, but this is not a requirement and, in other examples, txPClk1 and txV1 can be aligned, or txPClk1 can lead txV1.

Tx Interface 715 can forward data txD1[ ] and valid txV1, received at stage 1, to Tx Link Macro 725 as data txD2[139:0] and txV2 at stage 2, accompanied by parallel clock txPClk2. Timing of these signals is shown in diagram 720. In this illustration, the timing of txD2, txV2, and txPClk2 is substantially similar to the timing of txD1, txV1, and txPClk1, but this is not a requirement. For example, the phases of txPClk1, txPClk2 can differ. Tx Link Macro 725 can also be provided with a continuous serial clock txSClk2 as shown. Clocks txPClk1, txPClk2, txSClk2 can be generated by a clock generation module at the data source, not shown, which can include one or more phase-locked loops (PLL). txPClk2 and txPClk1 can be a same clock signal. In this illustration, the 140 bit data path txD2 is treated as N=14 lanes of W=10 bits each. txPClk2 is a single-rate clock whose edges are rising transitions. txSClk2 is a double-rate clock having edges at both rising and falling edges. Thus, one period of txPClk2 has a duration equal to five periods of txSClk2, which is W=10 edges of txSClk2.

The output of Tx Link Macro 725 includes N=14 lanes of serialized data txD3[13:0] accompanied by serial clock txSClk3. Timing details are shown in diagram 730. Arrows 731-734, 741-744 show the relationships between signals in stage 2 diagram 720 and stage 3 diagram 730. Initially, txPClk2 lagging txV2 and txD2[ ], as shown, allows data txD2[ ] to be latched on rising edge 721 of txPClk2, with txV1 being detected as ON (logic high), and W=10 bits of first data word D1 can be outputted serially as txD3 for each lane n∈[13:0], synchronously with W=10 cycles of serial clock txSClk3, as shown by arrows 741, 731 respectively. The second parallel clock cycle 712A is clocked by edge 722 of txPClk2 but, because txV2 is detected as OFF (logic low), no data or clock edges are driven on lanes txD3[ ], txSClk3 for this parallel clock cycle. Rather, data lanes txD3[ ] and clock lane txSClk3 are put into respective idle states responsive to txPClk2 edge 722, as shown by arrows 742, 732.

Third parallel clock cycle 713A operates similarly to cycle 711A. Because txV2 is detected as ON, W=10 cycles of txSClk3 and txD3[ ] are outputted responsive to edge 723, as shown by arrows 733, 743. Thus, parallel data word D2 is transmitted across the illustrated data link as 14 lanes of serial data.

Fourth parallel clock cycle 714A also detects txV2 as ON at edge 724, and serialized data word D3 is outputted synchronously with serial clock edges immediately following transmission of data word D2, as shown by arrows 744, 734.

In this example, clock lane txSClk3 and data lanes txD3[ ] are idle when no data is to be transmitted (e.g. cycle 712A, and also the cycle preceding 711A), which can provide significant power saving. Moreover, edges of txSClk3 are sufficient to indicate valid data on data lanes txD3[ ]. Because no valid signal is required across interposer 735, additional power and space savings can be achieved.

After passing through interposer 735, transmission bus signals txD3[13:0], txSClk3 can be delivered to data sink circuits as rxD4[13:0], rxSClk4. In this illustration the rx . . . 4 signals can have substantially similar timing as the tx . . . 3 signals, and diagram 730 can cover both stages 3 and 4 of the illustrated data path.

Rx Link Macro 745 can receive the rx . . . 4 signals and can deserialize the data lanes to reconstitute parallel data rxD5 [139:0]. Parallel clock rxPClk5 can also be generated, e.g. by a clock regeneration module similar to 435. Based on the last serial clock edge 736 of rxSClk4 for cycle 711A, edge 751 of rxPClk5 can be generated, as indicated by arrow 771, which in turn can be used to drive parallel output word D1 as indicated by arrow 756.

The end of cycle 723 can operate similarly. The last edge 738 of rxSClk4 can cause parallel clock edge 753 to be generated via arrow 773, in turn outputting parallel data D2 via arrow 758.

Stage 6 signals, from Rx Interface 755 to sink logic 765 are shown in diagram 760. Rx Interface 755 can forward parallel data rxD5[ ] substantially unchanged as rxD6[ ], as shown by data alignment at 761, 763, and can delay the parallel clock, as shown by arrows 766, 768. In this way, the same edges 751, 753 used to drive data words D1, D2 on rxD5[ ] can be available at 771, 778 to latch data words D1, D2 from rxD6[ ], providing zero cycle exit from the data link.

First Example Method

Figure 8:
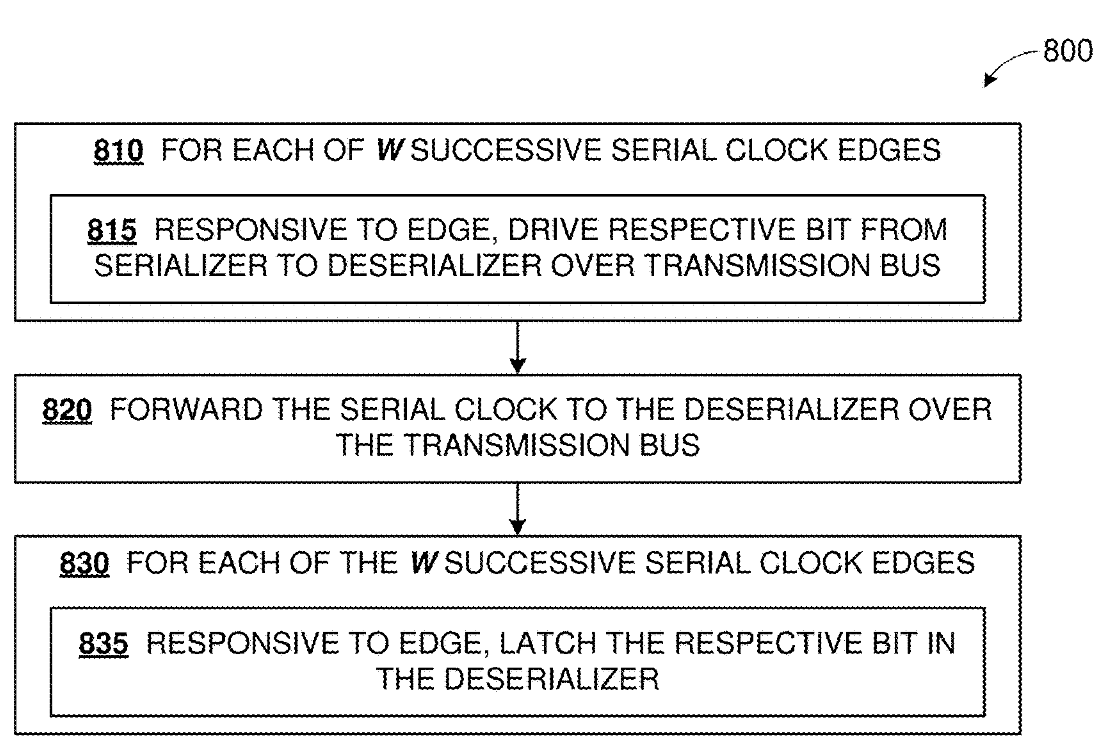
FIG. 8 is a flowchart of a first example method according to the disclosed technologies.

FIG. 8 is a flowchart 800 of a first example method according to the disclosed technologies. In this method W successive edges of a serial clock are used both to drive W bits serially and to receive the driven W bits. This method, its variations, and extensions can be performed with hardware similar to that described in context of FIGS. 1, 4, or with signals similar to those described in context of FIG. 7.

Block 810 can iterate over W successive edges of a serial clock, performing process block 815 for each of the edges. At block 815, responsive to the edge, a respective bit can be driven from serializer (which can be similar to serializer 110 of FIG. 1) to deserializer (130) over a transmission bus (120).

At block 820, the serial clock (including the W successive edges) can be forwarded to the deserializer over the transmission bus, similar to transmission of serial clock 125 in FIG. 1.

Block 830 can iterate over the W serial clock edges, performing process block 835 for each of the edges. At block 835, responsive to the edge, the respective bit can be latched by a receiving device in the deserializer.

Numerous variations and extensions can be implemented within scope of the disclosed technologies. The serial clock can be delayed between the serializer and the deserializer relative to the driven bits on the data lane. An active delay can be implemented with a buffer gate, or a passive delay can be implemented based on length of transmission wires and propagation speeds. As discussed further in context of FIGS. 5-6, timing constraints can be tight, in the face of power supply voltage spikes at clock edges, and the dependence of propagation delays on the voltage waveform. The propagation delay of the delayed serial clock relative to the driven bits can meet setup and hold timing constraints at the receiving device in the deserializer over all design corners.

Blocks 810, 815, 820 can be performed on a data source die similar to 411 of FIG. 4, while blocks 830, 835 can be performed on a data sink die similar to 431.

Figure 9:
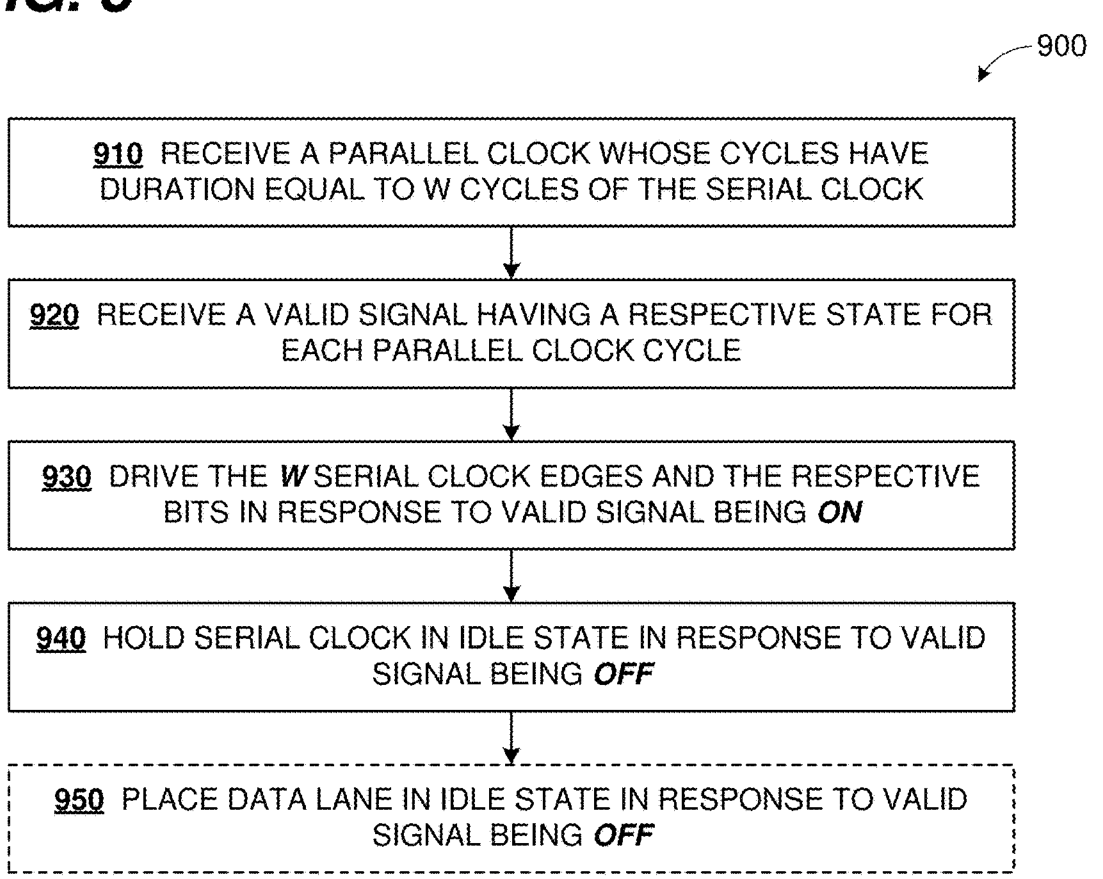

Other extensions are described in context of flowcharts 900, 1000 of FIGS. 9-10. Starting with FIG. 9, at process block 910 a parallel clock signal can be received, and at process block 920 a valid signal can be received. The parallel clock can define parallel clock cycles having a duration equal to W cycles of the serial clock, and the valid signal can have a single respective state (commonly, ON or OFF) for each clock cycle. That is, changes in the state of the valid signal can occur from one cycle to the next. Illustratively, the parallel clock cycles can include first, second, and third clock cycles, in that order.

At block 930, with the valid signal ON for the second parallel clock cycle, blocks 810, 815 can be performed, thereby driving the W bits on successive edges of the serial clock over a data lane. Additionally, the W edges of the serial clock can themselves be driven over a clock lane.

At block 940, with the valid signal OFF for the first or third parallel clock cycles, the serial clock can be held in an idle state free of additional edges.

Block 950, shown in dashed outline, can be performed as a further optional extension. The data lane can also be placed in an idle state in response to the valid signal being OFF for the first or third parallel clock cycles. Block 950 is shown in dashed outline to indicate that blocks 910-940 can be performed with or without block 950 being performed. The idle states for the clock lane and the data lane can be implemented in same or different manner. To illustrate, the idle clock lane can be driven to a constant logic level, while the idle data lane can be placed in a high-impedance state.

The parallel clock and the serial clock can be configured as single-rate or double-rate clocks in any combination.

Turning to FIG. 10, the deserializer latching data at block 835 can output deserialized parallel data according to a parallel clock. At block 1010, an edge of this parallel clock can be generated responsive to the last of the W serial clock edges received from the clock lane. To illustrate, the serial clock edges can be inputted to a divide-by-W counter to obtain the parallel clock. This parallel clock edge can drive a zero cycle path downstream of the deserializer. In particular, the parallel clock edge can transfer the output parallel data word at each of a series of one or more registers, eventually delivering the data word for storage in a FIFO.

Third Example System

Figures 11A, 11B:
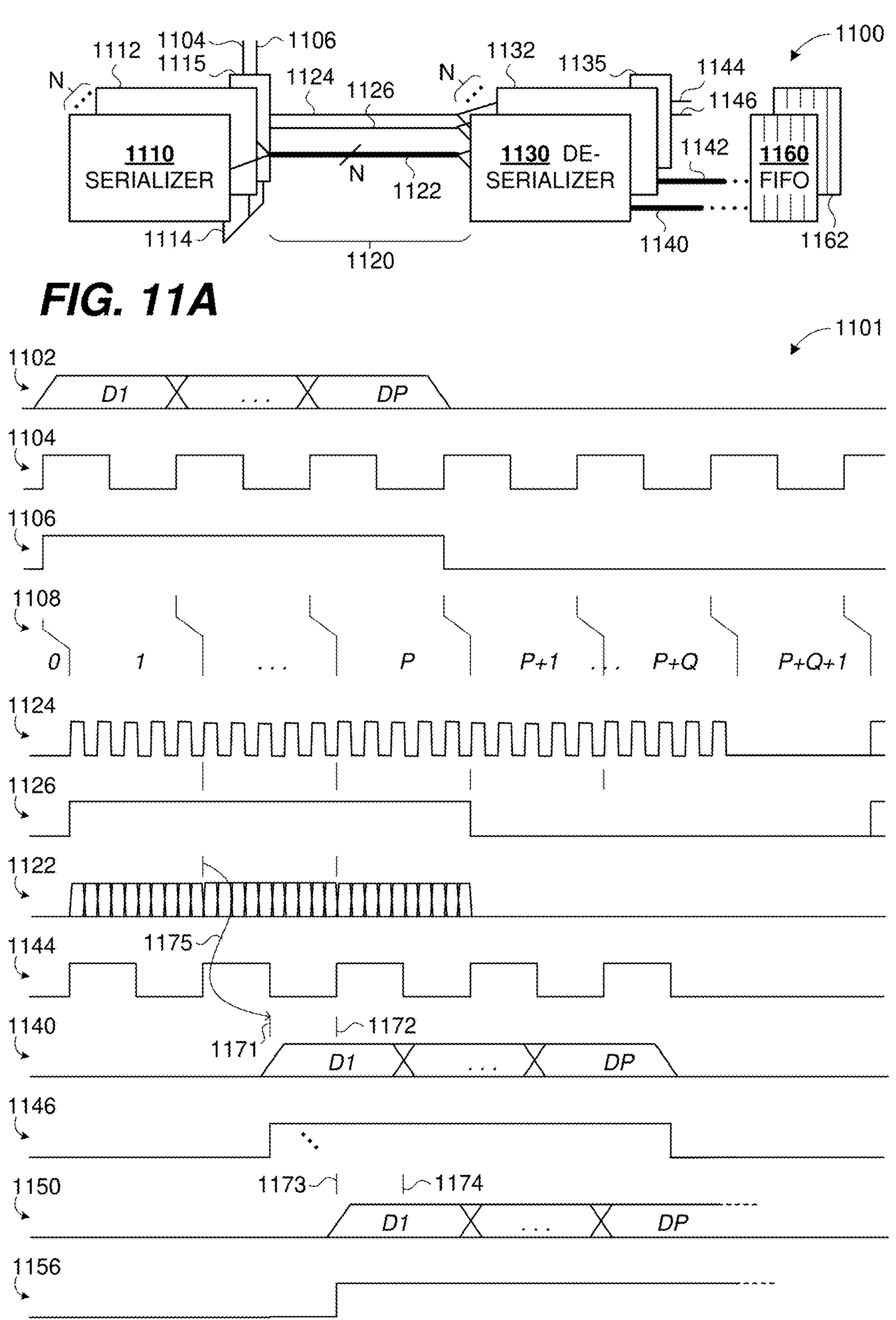
FIGS. 11A-11B are diagrams illustrating a first example short cycle data link in a third system according to the disclosed technologies.

FIGS. 11A-11B are diagrams 1100-1101 illustrating a third example system implementing a first short cycle data link. FIG. 11A depicts the architecture of this system and FIG. 11B depicts a temporal view of some signals of this data link.

Starting with FIG. 11A, serial transmission bus 1120 has N data lanes 1122, clock lane 1124, and valid lane 1126. Bus driver 1115 is coupled to receive a parallel clock signal 1104 and a valid signal 1106, which are also shown in FIG. 11B and described further below. In FIG. 11B, markers 1108 show the demarcation of parallel clock cycles according to illustrative single-rate clock 1104.

Returning to FIG. 11A, N serializers 1110 . . . 1112 at a data source are coupled to drive the N data lanes 1122 and N deserializers 1130 . . . 1132 are coupled to receive the N data lanes 1122, clock lane 1124, and valid lane 1126, and output parallel data 1140 . . . 1142. Clock regenerator module 1135 can also receive clock lane 1124 and valid lane 1126, and can generate parallel clock 1144 and valid signal 1146 common to all deserializers 1130 . . . 1132.

Operation of the third system described with reference to signals shown in FIG. 11B. Signals 1102, 1104, 1106 show signals presented to the data link at the data source. Initially, P parallel data words D1:DP 1102 can be provided to each serializer 1110 on successive cycles 1:P of parallel clock 1104. Valid signal 1106 can indicate the cycles 1:P on which valid data is presented.

FIG. 11B shows signals on the transmission bus 1120 for the illustrated scenario. For parallel clock cycles 1:P, bus driver 1115 can drive P·W cycles of double-rate serial clock 1124 with valid signal 1126 ON. For cycles P+1:P+Q, bus driver can drive another Q·W cycles of serial clock 1124 with valid signal 1126 OFF. Each parallel clock cycle has a duration equal to W serial clock cycles. W=10 in the illustrated example. For cycle P+Q+1, clock lane 1124 can be placed in an idle state and valid signal 1126 can be maintained OFF. For parallel clock cycles 1:P, each serializer 1110 can drive P·W bits of data on the P·W edges of serial clock 1124 over respective data lane 1122.

FIG. 11B also shows data sink link signals associated with deserializer and bus receiver output. Bus receiver 1135 can be configured to generate P+Q cycles of parallel output clock 1144 from the (P·W+Q·W) cycles of serial clock 1124. Each deserializer 1130 can be configured to latch the P·W bits of data received over respective data lane 1122 and to drive P output words D1:DP 1140, based on the P·W bits of received data, on respective cycles of output clock 1124. Valid signal 1146 can be driven ON synchronously with the output data words D1:DP 1140. In this illustration, data 1140 and valid 1146 can be delayed by a half cycle 1175 of parallel output clock 1144. Thus, word D1 of data 1140 can be driven on falling clock transition 1171, and can be latched at a following register on rising clock transition 1172. Instead of half-cycle delays, full cycle or other delays can also be used.

Still further, FIG. 11B shows signals downstream of serializers 1130 . . . 1132. Data and valid signals at each successive register can be delayed a half cycle from a previous register, e.g. by using inverted clocks on successive registers. Eventually, word D1 of data 1150 can be driven on clock transition 1173 and latched, e.g. in FIFO 1160, on clock transition 1174.

Numerous variations and extensions can be implemented within scope of the disclosed technologies. Serial clock 1114 can be distributed from a clock generator (not shown) to serializers 1110 . . . 1112 and optionally to bus driver 1115. In other examples, the serial clock generator can be part of bus driver 1115. Parallel clock cycle markers 1108 show an offset between signals 1102, 1104, 1106 presented to the data link and the corresponding cycles on serial transmission bus 1120. This offset can correspond to clock synchronization delay by half, one, or another multiple of a parallel clock or a serial clock, in any combination. Similar to the embodiments of FIGS. 1-4, embodiments of FIGS. 11A-11B can be integrated into integrated circuit packages and computers, e.g. for neural network or artificial intelligence applications.

Fourth Example System

Figure 12B:
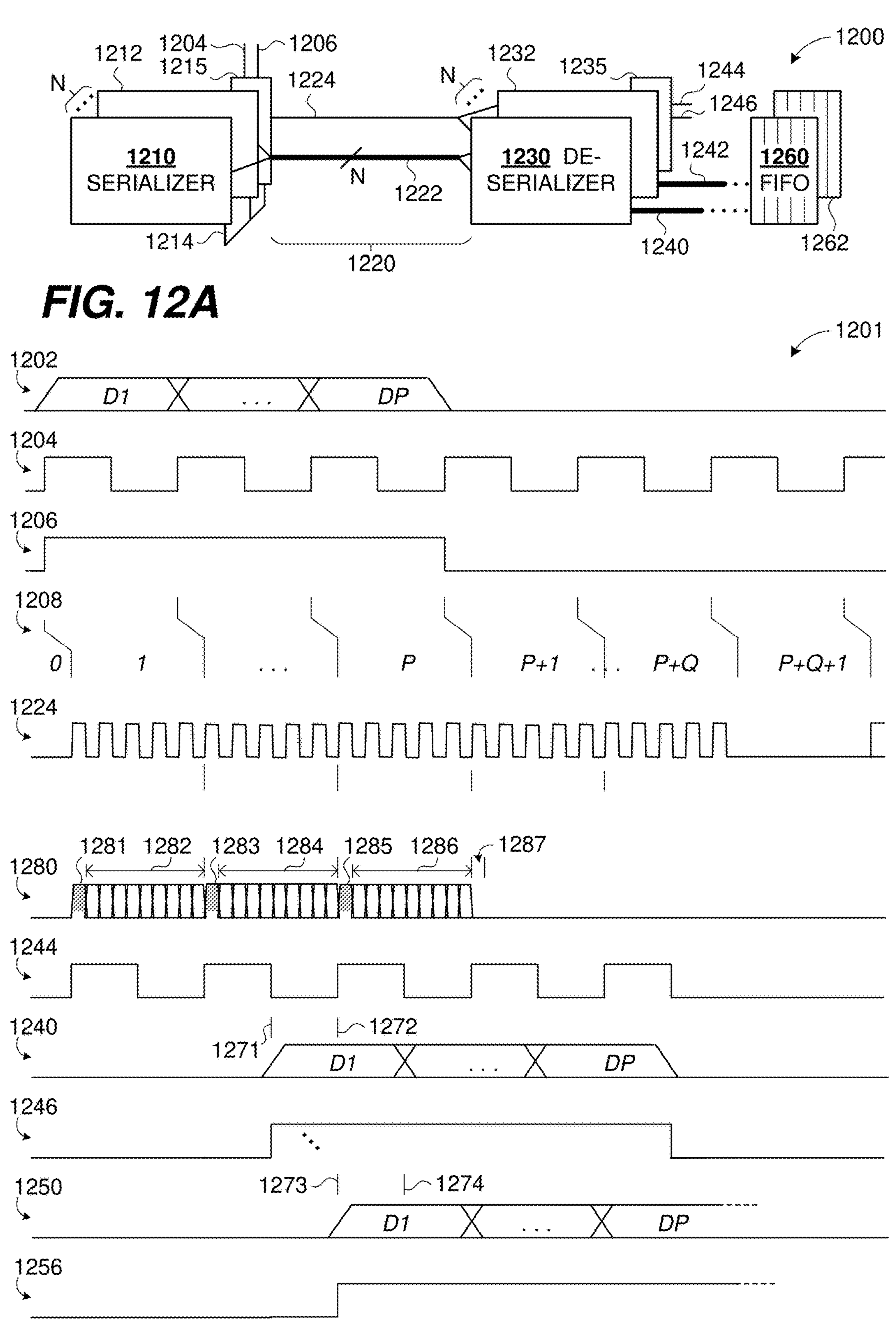

FIGS. 12A-12B are diagrams 1200-1201 illustrating another example system, implementing a second short cycle data link. FIG. 12A depicts the architecture of this system and FIG. 12B depicts a temporal view of some signals of this data link.

Beyond certain distinctions noted herein, elements 1204-1262 shown in FIG. 12A are generally similar to correspondingly numbered elements of FIG. 11A, and description of these similar aspects is not repeated. Notably, transmission bus 1220 omits a valid lane similar to 1126, signaling on data lanes 1222 differs from signaling on lanes 1122, and serializers 1220 and deserializers 1230 are modified to support such data lane signaling.

Turning to FIG. 12B, the parallel clock and data cycles of signals 1202, 1204, 1206, 1208, 1244, 1240, 1246, 1250, 1256 are substantially unchanged from correspondingly numbered signals of FIG. 11B and description is not repeated. However, signal 1280 illustrates signaling on at least one data lane 1222. Each W bit serial word comprises a valid bit 1281, 1283, 1285 followed by W−1 bits (1282, 1284, 1286) of content data. Thus, each W bit serial word can encode a W−1 bit parallel word D1 . . . . DP. For parallel clock cycles 1 . . . . P having valid content data D1 . . . . DP, serializer 1210 can place valid bit (e.g. set to logic High) 1281 on the data lane, along with W−1 data bits 1282. For parallel clock cycles P+1 . . . . P+Q+1, serializer 1210 can set valid bit 1287 to an opposite state (e.g. logic Low). Correspondingly, deserializer 1230 can decode valid bits 1281, 1283, 1285 to recognize subsequent bits 1282, 1284, 1286 as valid, and can decode bit 1287 to recognize that there is no valid data for parallel cycle P+1, and similarly for other parallel cycles up to P+Q.

Thus, the data link embodiment of FIG. 12 carries a valid signal over a logical channel in a data lane, in contrast to the embodiment of FIG. 11 in which a valid signal occupies a physical channel with its own lane.

In some embodiments, valid bits 1281, 1283, 1285, 1287 can be encoded in all N data lanes 1222. To illustrate, a 140-bit parallel data word can be split into 14 10-bit words, each of which can be transmitted in a respective serial word of W=11 bits: 10 bits for the content data and an 11th bit indicating valid data. Such a system can also support different valid parallel data cycles on different data lanes sharing a common serial clock lane. In other embodiments, a single valid bit can be shared among two or more data lanes 1222. To illustrate, a 140-bit parallel data word can be split into 12 11-bit words and an 8-bit word. The 12 11-bit words can be transmitted over 12 serial data lanes 1222 with W=11 serial clock cycles (for one parallel clock cycle). A 13th data lane 1222 can transmit the 8-bit word, a valid bit, and two padding bits in the same 11 serial clock cycles.

Example Architecture for Source Clock Phase Calibration

Figure 13:
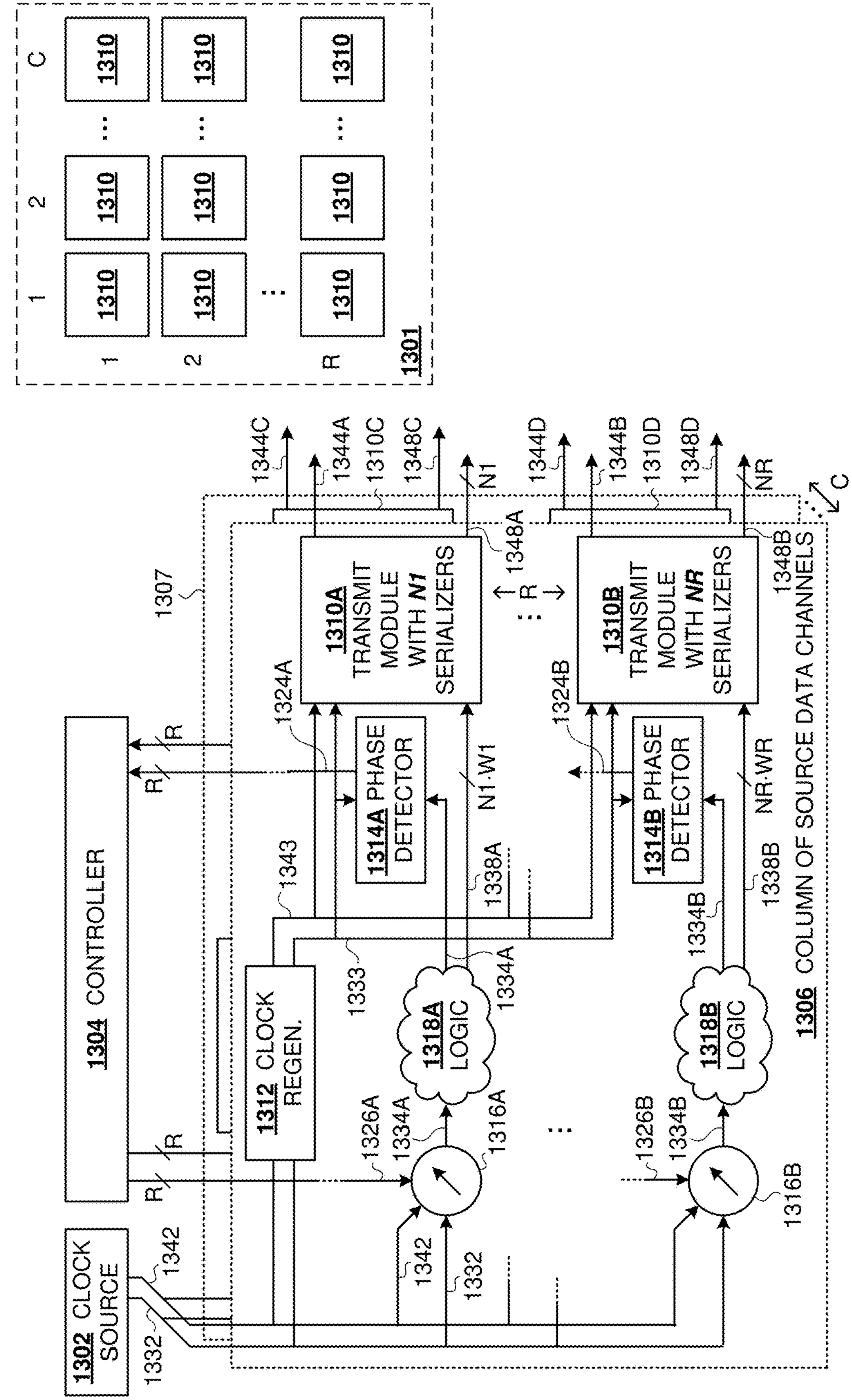
FIG. 13 is a diagram of an example transmit-side architecture in which source clock phase calibration can be performed according to the disclosed technologies.

FIG. 13 is a diagram 1300 of an example transmit-side architecture in which source clock phase calibration can be performed. A serialized data link as described herein can include a transmission bus (not shown) coupling a transmitter module 1310, 1310A, 1310B and a receiver module (not shown). The transmission bus can incorporate a serial clock lane, one or more serial data lanes, and optionally one or more additional lanes. The transmitter module can include respective serializers for each of the serial data lanes. Serialized data links disclosed herein can be cascaded in arrays. Inset 1301 shows an array of data link transmitter modules 1310 organized as R rows and C columns. Individual modules 1310 in column 1306 are distinguished by suffixes A, B. Circuitry 1306 pertinent to one column of transmitter modules 1310A-1310B is illustrated in FIG. 13. Other columns' circuitry 1307 can be similar. The row and column organization of transmitter modules 1310 is merely illustrative: rows and columns can be interchanged; transmitter modules can be grouped in other ways; some implementations can have a single group of transmitter modules or even a single transmit module 1310.

The description of FIG. 13 focuses on signals and components associated with transmitter module 1310A of column 1306. Signals and components associated with transmitter module 1310B have suffix B and, being similar to those associated with module 1310A, are not described further. Particularly, calibration for transmitter modules 1310B-1310D can be similar to that described for module 1310A. Column 1306 can have R transmitter modules 1310, as variously indicated by dotted lines and "/R" width annotations on certain signals. Rows not shown can also operate similarly. A few signals with suffix C, D associated with column 1307 are also similar to correspondingly numbered signals with suffix A.

In this system, source logic 1318A provides parallel data 1338A for serialized transmission by transmitter module 1310A over a data link. The parallel data cycles are controlled by source clock 1334A. The serialized data link operates according to serial clock 1343, which can be synchronized with a parallel clock 1333. Disclosed source clock calibration enables source logic 1318A to be synchronized with the serialized data link, without incurring a latency penalty of additional synchronizing flip-flops.

FIG. 13 also illustrates a clock distribution architecture. Clock source 1302 can distribute parallel clock 1332 and serial clock 1342 across a die. Parallel clock 1332 can be distributed toward logic 1318A-1318B associated with all transmit modules 1310 in C columns 1306-1307. Serial clock 1342 can be distributed toward transmitter modules 1310A-1310D and toward phase calibration modules 1314A, 1316A.

Clock regenerator module 1312 can forward serial clock 1343 and parallel clock 1333 to the R transmitter modules 1310A-1310B. Parallel clock 1333 can be synchronized to serial clock 1343, e.g. by a delay-locked loop (DLL). Clocks 1333, 1343 can be tightly synchronized by design, e.g. laid out using analog design tools or having small distribution trees. Exemplary distribution trees for clocks 1333, 1343 can be 1-5 buffers deep and 1-10 buffers wide to maintain phase variation under 2 ps, 5 ps, or 10 ps in varying examples. Clock 1343 can be identical to clock 1342, but this is not a requirement and, in other examples, clock 1343 can be phase-shifted, inverted, or retimed relative to clock 1342.

The clock distribution of FIG. 13 is illustrated at a high level. Any given clock signal can incorporate additional buffers or tree branches, not shown. Clock signals throughout a given tree or buffer chain are considered a same clock signal.

Turning to clock calibration, phase tuner 1316A can be coupled to adjust phase of source clock 1334A (e.g. relative to master clock 1332). Source clock 1334A can drive logic 1318A to generate parallel data 1338A to be serialized and transmitted by transmitter module 1310A. Module 1310A can support N1 data lanes driven by N1 serializers, each serializing W1 parallel bits for transmission over the respective data lane. To illustrate, a 140-bit parallel word can be serially transmitted on N1=14 data lanes carrying W1=10 serial bits each. The group of N1 serializers can be controlled in part by parallel clock 1333. For example, parallel data 1338A can be latched on edges of parallel clock 1333. N1 can be a positive integer, commonly in a range 1-100.

Phase detector 1314A can receive parallel clocks 1333, 1334A and can output a signal 1324A indicating a phase relationship between clocks 1333, 1334A. In varying examples, the phase relationship can be whether clock 1334A leads or lags clock 1333, or a measure (in temporal or angular units) of a phase difference between signals 1333, 1334A. Whereas the phase of clock 1333 can be tightly controlled, clock 1334A can have widely variable phase, e.g. due to having a very large clock distribution tree with width 10-10,000 (often 100-1000) or depth 1-100 (often 2-50 or 5-20). With practical digital design techniques, variability in clock 1334A phase can commonly be 30-3000 ps, often 100-1000 ps or 200-500 ps.

Controller 1304 can receive signal 1324A and can thereby monitor the phase relationship between clocks 1333, 1334A. Controller 1304 can generate signal 1326A to progressively adjust the phase of parallel clock 1334A. As described herein, phase tuner 1316A can receive serial clock 1342, and the phase adjustment can be in steps of half or one period of serial clock 1342. Phase adjustment can continue until, at a particular value PH1 of the adjusted phase, the phase relationship detected by phase detector satisfies a predetermined criterion. To illustrate, the criterion can be a transition from clock 1334A lagging clock 1333 to clock 1334A leading clock 1333. Then, controller 1304 can control phase tuner 1314A to set the phase of clock 1334A based on the value PH1 at which the criterion was satisfied. In some examples, the phase can be maintained at PH1. In other examples, the phase can be set to a predetermined offset relative to PH1. Illustratively, the phase can be set to two steps beyond PH1; to the step immediately preceding PH1; or half a parallel clock period after PH1.

Thus, controller 1304 can align the phases of clocks 1333, 1334A to within one adjustment step, which can be one cycle or half a period of serial clock 1342. Logic 1318A can be designed to output data 1338A with skew (relative to clock 1334A) within a predetermined range. Thereby, after calibration, clock 1333 can be used to reliably latch data 1338A in transmitter module 1310A over all design corners. Thus, zero-cycle entry into the serial data link can be achieved with minimum latency between parallel data 1338A and the N1 lanes of serial data 1348A. Transmitter module 1310A can also output serial clock 1344A to define cycles of data 1348A. As described herein, serial clock 1344A can be gated according to whether data lanes 1348A contain valid data.

Numerous variations and extensions can be implemented within scope of the disclosed technologies. Functions of controller 1304 can include switching between (i) a calibration mode, in which output 1324A of phase detector 1314A is used to adjust a variable phase shift of phase tuner 1316A and (ii) an operation mode, in which the phase shift of tuner 1316A is held at a fixed value based on the calibration. Some or all functions of controller 1304 can be distributed among phase detector 1314A and phase tuner 1316A, so that signal 1324A goes directly to tuner 1316A, as signal 1326A.

The circuitry illustrated for columns 1306, 1307 can be integrated on a single die. Controller 1304 can be integrated on this die, or can be remote. A remote controller can be shared among transmitter modules 1310 of multiple dice. Controller 1304 can be configured to calibrate source logic clocks for multiple transmitter modules 1310 sequentially or concurrently, in any combination. The controller can include computer-readable memory storing instructions, which when executed by the controller, cause the controller to: monitor the detected phase relationship 1324A; adjust, via signal 1326A, the phase of parallel clock 1334A; and maintain a calibrated setting of phase tuner 1316A, e.g. in an operation mode.

As discussed in context of FIGS. 2-3, the circuitry illustrated for columns 1306-1307 can also be incorporated into an integrated circuit package, or into a computer.

Example Phase Detector

FIGS. 14A-14B are diagrams 1401, 1402 illustrating operation of a phase detector implemented as a D-type flip-flop (DFF) 1414. In examples, phase detector 1314A-1314B can be implemented as shown in FIG. 14. In both FIGS. 14A-14B, DFF 1414 is configured to receive clock signals 1433, 1434 on its data (D) and clock (>) inputs respectively. Clocks 1433, 1434 can have equal period with some phase relationship. In this illustration, DFF 1414 samples its data input signal 1433 on rising transitions of its clock input signal 1434.

FIG. 14A illustrates a case where clock 1433 leads clock 1434. On every rising transition of clock 1434, data input 1433 is already in a logic High state, and is sampled as High. Accordingly, output (Q) of DFF 1414 can be held in a high state as long as the illustrated phase relationship between clocks 1433, 1434 is maintained.

FIG. 14B illustrates a case where clock 1433 lags clock 1434. On every rising transition of clock 1434, data input 1433 is still in a logic Low state, and is sampled as Low. Accordingly, output (Q) of DFF 1414 can be driven to a Low state.

With reference to phase detector 1314A, precise clock 1333 can be coupled as D input 1433, source logic clock 1334A can be coupled as clock input 1434, and output 1424A can be coupled as phase monitor signal 1324A. In such a configuration, phase monitor signal 1324A can take values High and Low according to whether clock 1433 leads or lags clock 1434A.

In some examples, phase steps of phase tuner 1316A can progressively advance edges of clock 1334A. Advancing a clock edge (e.g. bringing the edge nearer a preceding edge) can be preferred over delaying the clock edge, so as to avoid double-clocking on a same edge before and after the delaying. Then, as clock 1434 passes through phase alignment with clock 1433, output 1424 goes from High (clock 1434 lagging as in FIG. 14A) to Low (clock 1434 leading as in FIG. 14B). Accordingly, a High-to-Low transition of output Q 1424 (or 1324A) can be used as a criterion to detect phase alignment between clocks 1433, 1434 (or 1333, 1334A).

In variations, the data and clock inputs of DFF 1414 can be interchanged, DFF 1414 can sample on a falling transition of clock 1434, or the detected phase relationship can be alignment between a sampling transition of clock 1434 and a falling edge of clock 1433.

Example Phase Tuner

FIG. 15 is a diagram illustrating an exemplary phase tuner 1500 implemented as a circulating shift register. In examples, phase tuner 1316A can be implemented as shown in FIG. 15. As illustrated, ten progressively delayed copies of an input signal 1532 can be outputted to inputs 0-9 of multiplexer 1570. Four control bits 1526 can select among inputs 0-9 as output 1534. Thus, output 1534 can be a selectively delayed copy of input 1532.

Phase tuner 1500 can be applied to the system of FIG. 13 by providing a serial clock similar to 1342 as input 1542, and providing a parallel clock similar to 1332 as input 1532. Control input 1326A can be 4-bit selection input 1526, and selectively delayed output 1534 can provide source logic clock 1334A to source logic 1318A.

With alternating DFFs 1560-1569 clocked on rising and falling transitions of clock 1542 as illustrated, phase tuner 1500 can provide ten selectable delays of half a period of serial clock 1542, and can be suitable for a configuration where clock 1532 has a period five times the period of clock 1542.

Numerous variations and extensions can be implemented within scope of the disclosed technologies. More or fewer DFFs can be used in place of chain 1560-1569 according to the ratio of periods of clocks 1532, 1542. Coarser steps can be provided by clocking all DFFs 1560-1569 on a same polarity (e.g. rising or falling) transition of clock 1542; by reducing the width of multiplexer 1570 so that not all outputs from DFFs 1560-1569 are available as inputs of multiplexer 1570; or by skipping steps while changing control input 1526. Illustratively, multiplexer steps of one, two, three, or four half-periods of serial clock 1542 can be implemented. In cases where rising transitions of clocks 1532, 1542 are in alignment, first DFF 1560 can be replaced with a buffer. To progressively advance transitions of output 1534, e.g. to successively select inputs 6, 5, 4, . . . of multiplexer 1570, control bits 1526 can be decremented. Gray code encoding can be used for control bits 1526. Phase tuner 1500 can be cascaded with a fine tuner implemented, e.g., with buffer delays.

Example Source Clock Phase Calibration

FIG. 16 is a timing diagram 1600 illustrating a first example calibration according to the disclosed technologies. Clocks 1642, 1633 represent an exemplary serial clock 1342 and its precisely synchronized parallel clock 1333 respectively. Clock 1634 represents source logic clock 1334A which is desired to be aligned with clock 1633. Tick marks on axis 1626 indicate a position of edge 1666 according to a tap position 0-9 of multiplexer 1570. Thus, the solid line trace shown for clock signal 1634 corresponds to multiplexer 1570 selecting tap 1. With clocks 1634, 1633 respectively provided to inputs 1434, 1433 of phase detector 1414, phase detector output 1424 will be High as shown in FIG. 14A.

Advancing multiplexer 1570 to tap 0 can advance rising transition 1666 to position 1680, still lagging transition 1663 of clock 1633, and maintaining High output 1424. Another advance to tap 9, can further advance edge 1666 to position 1689. Now, with clock 1634 leading clock 1633, output 1424 can go Low as shown in FIG. 14B.

In some examples, clock 1634 can be held at tap 9, with rising transition at 1689. In other examples, clock 1634 can be advance nine more times to restore rising transition to 1680 (just before the High to Low transition). In further examples, a different offset can be applied.

Second Example Method

Figures 17, 18, 19:
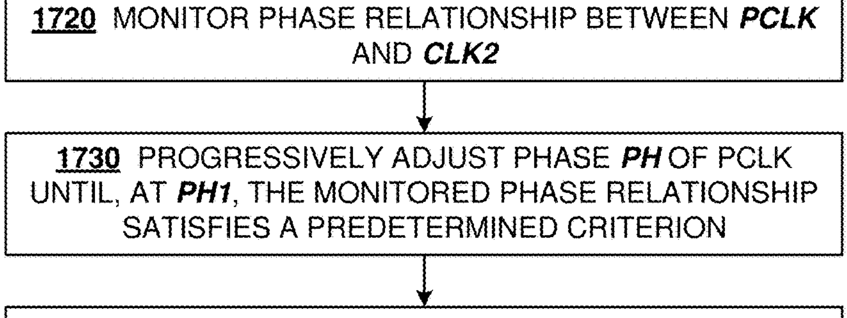
FIG. 17 is a flowchart of a second example method according to the disclosed technologies.
FIGS. 18-19 are flowcharts of example extensions to the method of FIG. 17.

FIG. 17 is a flowchart 1700 of a second example method for performing source clock phase calibration. For clarity of illustration, this method is described with reference to FIGS. 13-16. However, the use of apparatus and techniques described in context of FIGS. 13-16 is not a requirement.

At process block 1710, a parallel clock PCLK (similar to 1334A of FIG. 13) can be applied to drive logic (1318A) which generates parallel data (1338A) to be transmitted by a group of one or more serializers (1310A) over respective data lanes (1348A). The serializer(s) can be controlled in part by clock CLK2 (1333). Clocks PCLK, CLK2 can have equal periods.

At process block 1720, a phase relationship between PCLK and CLK2 can be monitored. At block 1730, the phase PH of PCLK can be progressively adjusted until, at a particular value PH=PH1, the monitored phase relationship satisfies a predetermined criterion. At process block 1740, phase PH can be set based on the value PH1.

Numerous variations and extensions can be implemented within scope of the disclosed technologies. Blocks 1710, 1720, 1730 can be performed in a calibration mode of a data link from serializer(s) 1310A to counterpart deserializer(s). After completion of the method, the data link can be put into an operation mode, with the calibrated phase applied to PCLK. The group of serializer(s) can be a single serializer or multiple serializers.

In some examples, monitoring at block 1720 can be performed by latching CLK2 on transitions of PCLK, as described in context of FIGS. 14A-14B, or by latching PCLK on transitions of CLK2. In some examples, serializer (s) 1310A can be controlled in part by a serial clock (1343) and block 1730 can be performed in steps of one, two, three, or four half-periods of the serial clock. The predetermined criterion can be a transition between PCLK leading CLK2 and PCLK lagging CLK2. The setting at block 1740 can include applying an offset to PH1, e.g. setting phase PH to PH1+Offset. As described further, the offset can include a fine adjustment or can be a predetermined offset.

Other extensions are described in context of flowcharts 1800, 1900 of FIGS. 18-19. FIG. 18 illustrates a fine adjustment extension of the second method. At block 1810, coarse adjustment of PH can be performed, e.g. using block 1730, or the entire method of FIG. 17. At block 1820, successive fine phase adjustments of PCLK can be performed until, at a refined value PH2 of phase PH, the monitored phase relationship satisfies the predetermined criterion (e.g. High to Low transition of a phase detector output). At block 1830, phase PH of PCLK can be set based on PH2.

To illustrate, at block 1730 coarse adjustment can detect a transition at position 1689 of FIG. 16 (tap 9 of FIG. 15, PH1) and, at block 1740, PH can be adjusted back to position 1680 (tap 0). Then, fine adjustment (block 1820) can be performed to more precisely locate an alignment position between 1680, 1689 at a refined value PH=PH2. At block 1830, phase PH can be set based on the value of PH2, which is also dependent on PH1.

FIG. 19 illustrates data link operation after completion of source clock (PCLK) phase calibration. At block 1910, phase PH can be adjusted, e.g. according to FIG. 17 or FIG. 18. At block 1920, parallel data (1348A) can be latched on a clock transition having a predetermined phase relationship with CLK2 (1343). At block 1930, the serializer(s) can transmit the latched data serially (1348A) over the data link.

Example Architecture for Receiver Phase Calibration

Figures 20, 21, 22A, 22B, 22C, 23:
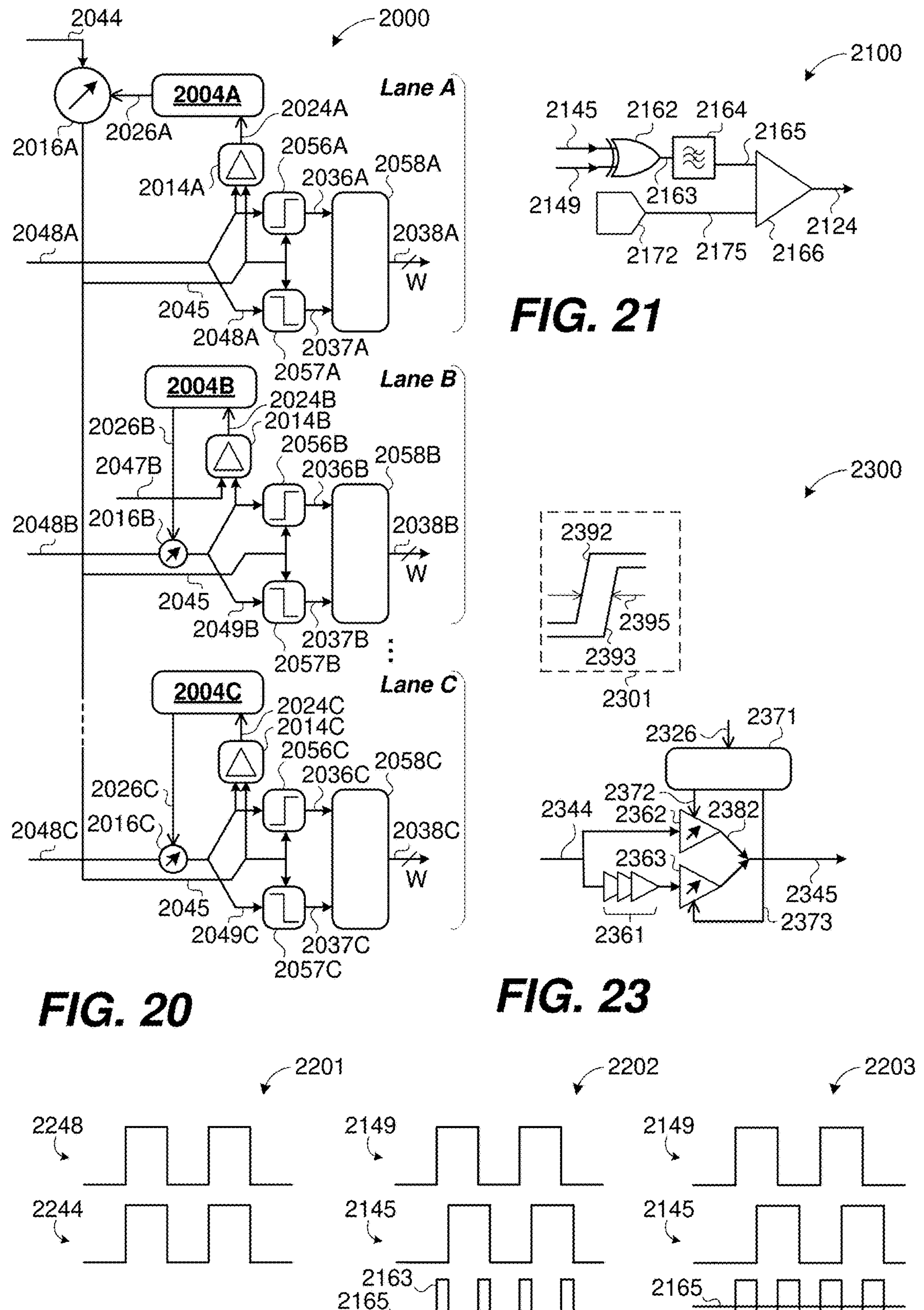
FIG. 20 is a diagram of an example architecture in which receiver phase calibration can be performed according to the disclosed technologies.
FIG. 21 is a diagram illustrating a phase detector which can be used in some examples of the disclosed technologies.
FIG. 22A-22C are timing diagrams illustrating receiver phase calibration according to examples of the disclosed technologies.
FIG. 23 is a diagram illustrating a phase interpolator which can be used in some examples of the disclosed technologies.

FIG. 20 is a diagram 2000 of an example architecture in which receiver phase calibration can be performed as disclosed herein. A serialized data link as described herein can include a transmission bus (similar to bus 120 of FIG. 1) having a serial lane (124) carrying serial clock 2044 and one or more data lanes (122) carrying respective serialized data streams 2048A-2048C. Deserializer signal paths for three data lanes are shown, having signals and components distinguished by respective suffixes A-C. Signals and components associated with lanes B and C can be similar to those described for lane A, with differences noted below.

Serial data stream 2048A is sampled by two samplers 2056A, 2057A on rising and falling transitions of serial clock 2045 respectively. Thus, for a ten bit serial data stream d0, d1, . . . d9, output 2036A of sampler 2036A can include bits d0, d2, d4, d6, d8, while output 2037A of sampler 2057A can include bits d1, d3, d5, d7, d9. Bitstreams 2036A, 2037A can be concurrent. Another deserialization stage within module 2058A operating at half the sampling rate of clock 2045 can generate four parallel streams (d0, d4, d8), (d1, d5, d9), (d2, d6), (d3, d7). Two more stages can complete the deserialization into a 10-bit parallel word do . . . d9. Generally, a W bit serial data stream can be converted in $\lceil \log_2(W) \rceil$ stages into a W bit parallel word, as indicated "/W" on output data 2038A.

Deserialization of serial data streams 2049B-2049C into parallel data words 2038B, 2038C is similar to that for data lane "A": the operation of similarly numbered components and symbols is not described further. The description turns to receiver phase calibration, which are depicted with variations for the three illustrated data lanes. Receiver phase calibration relies on being able to put special patterns on clock or data lines for the purpose of calibration. As described further herein, matching waveforms can be applied on clock and data lines to facilitate measurement of phase offset between them.

In data lane A, phase detector 2014A can monitor a phase offset between serial clock 2045 and data stream 2048A. Comparator output 2024A can be inputted to controller 2004A, from which output 2026A can control phase shifter 2016A. Phase shifter 2016A is in the serial clock path, introducing a phase shift in clock 2045 relative to serial clock 2044 received over the data link. In this way, the phase offset between clock 2045 and data 2048A can be adjusted to meet a predetermined target value within a predetermined tolerance. The target value and tolerance can be chosen so that samplers 2036A, 2037A latch data in the middle of an eye diagram where signal-to-noise or timing margin is maximized.

In some embodiments, a single calibration as shown in data lane A is sufficient to provide satisfactory alignment of all data lanes. However, in other embodiments, there can be a small residual variation between multiple data lanes of a given data link. Data lanes B and C illustrate fine phase calibration which can be applied to data lanes other than data lane A after coarse calibration with phase shifter 2016A has been completed.

In data lane C, like data lane A, phase detector 2014C can measure phase offset between serial clock 2045 and serial data 2049C. Based on comparator output 2024C, controller 2004C can generate control signal 2026C to fine phase shifter 2016C. Phase shifter 2016C is in a serial data path, introducing a phase shift in data stream 2049C relative to data stream 2048C received over a transmission bus of the data link.

Data lane B depicts a variation of the fine calibration of data lane C. Phase detector 2014B measures phase offset between data stream 2049B and reference signal 2047B, which can variously be: clock 2045, data 2048A (the data lane used for coarse clock phase adjustment), the data stream of an immediately preceding data lane, or another reference signal synchronous with clock 2045 or data 2048A.

Some examples of the disclosed technologies can include phase detector 2014A and phase shifter 2016A. Control signal 2026A can be derived from comparison output signal 2024A and can cause phase shifter 2016A to apply a phase shift in the clock lane that drives the phase offset between clock 2045 and data 2048A toward a target value. Phase detector 2014A can be implemented as described below in context of FIG. 21. Phase shifter 2016A can be implemented as described below in context of FIG. 23. The apparatus of FIG. 20 can be incorporated in deserializer modules 130, 430 of FIGS. 1, 4, and can be integrated into data link 101, IC package 202, computer 303, die 431, the system of FIG. 4, or other devices or systems disclosed herein.

Phase detectors 2014A-2014C can be placed proximate to respective samplers 2056A-2056C, 2057A-2057C. Phase shifters 2016A-2016C can be placed near source or sink ends of a data link, in any combination. Controllers 2004A-2004C can variously be placed proximate to transmitter (e.g. on a source die), receiver (e.g. on a sink die), or elsewhere.

Example Phase Detector

FIG. 21 is a diagram illustrating a phase detector 2100 implemented using an XOR gate. In examples, one or more of phase detectors 2014A-2014C can be implemented as shown in FIG. 21. FIG. 21 is described with reference to the timing diagrams 2201-2203 of FIGS. 22A-22C, which illustrate operation of receiver phase calibration using phase detector 2100 or a variation thereof.

XOR gate 2162 can be coupled to receive signals 2145 and 2148 from a serial clock lane and a serial data lane respectively. Signals 2145, 2148 can be similar to signals 2045, 2049B respectively, and can be phase shifted from corresponding signals 2044, 2048B present on a transmission bus. As shown in FIG. 22A, matching signals 2244, 2248 can be launched in calibration mode from a transmitter module (similar to 1310A of FIG. 13 or 110 of FIG. 1) on serial clock and data lanes (124, 122) respectively. After propagation delay (e.g. through transmission bus 120) and possible phase shift (e.g. by phase shifters similar to 2016A-2016B), corresponding signals 2145, 2149 can reach phase detector 2100 (similar to 2014B) with some phase offset as shown in FIG. 22B, resulting in XOR gate output 2163. If signals 2145, 2149 are perfectly aligned, XOR output 2163 can be logic Low and, if signals 2145, 2149 are offset by half a period, XOR output 2163 can be logic High. Passing signal 2163 through low-pass filter 2164 produces signal 2165 whose value can be the time average of XOR output 2163 and proportional to a phase offset between signals 2145, 2149.

In operation mode, it can be desirable to have clock signal 2145 lagging data signal 2149 by about half a data cycle (e.g. quarter period of a double-rate clock), so as to have sampling occur at the midpoint of a serial data cycle (similar to 533 of FIG. 5) for optimum performance. To achieve a target value of phase offset, DAC 2172 can be programmed to generate a reference signal 2175. Signal 2175 is the value of signal 2165 when signals 2145, 2149 have the target value of phase offset. Comparator 2166 can generate monitor output 2124 (similar to 2024A-2024C of FIG. 20) indicating whether the phase offset between signals 2145, 2149 is above or below the target phase offset. Monitor output 2124 in turn can be used by a controller (2004A-2004C) to drive measured phase offset 2165 to the target value 2175.

Generally, there can be two phase offsets having the same value of signal 2165, one with clock 2145 leading data 2149, the other with clock 2145 lagging. The polarity of comparator 2162 can be selected such that the desired phase offset (e.g. clock 2145 lagging data 2149) is a stable equilibrium and the other matching phase offset is unstable equilibrium. Alternatively, the polarity of phase control feedback can be implemented in controller 2004A-2004C or phase shifter 2016A-2016C, in any combination.

FIG. 22C illustrates a case where clock 2145 lags data 2149 by about half a serial data cycle and measured phase offset 2165 is midway between logic Low and High. The target phase offset 2175 can be equal to this value. In further examples, the target and equilibrium phase offset values can be offset slightly from the midway point, to account for a small sampling delay, e.g. in samplers 2056B, 2057B.

In a variation, signal 2165 can be used as a phase detector output (2024A-2024C) and functionality of DAC 2172 and comparator 2166 can be integrated with a controller (2004A-2004C) or phase adjuster (2016A-2016C). In other examples, phase detectors 2014A-2014C can be implemented using phase detectors similar to 1414 of FIG. 14.

Example Phase Interpolator

FIG. 23 is a diagram illustrating a phase interpolator 2300 which can be used to adjust phase in some embodiments of the disclosed technologies. For example, phase shifters 2016A-2016C can be implemented as shown in FIG. 23. FIG. 23 is described with reference to a phase shifter similar to 2016A in a serial clock lane. Similar phase interpolators can be used for phase shifters 2016B-2016C in data lanes.

Phase interpolator 2300 can apply a phase shift to a received digital signal 2344 to generate output digital signal 2345 having a controlled phase shift relative to input signal 2344. Initially, input signal 2344 can be split into two paths: one passing through buffer chain 2361 to variable drive strength buffer 2363; the other path direct to variable drive strength buffer 2362. Buffer chain 2361 can be a series string of 1-100 inverting or non-inverting buffers, producing a delay generally proportional to the number of buffers in chain 2361. Thus, buffers 2362, 2363 receive matching signals that are temporally offset from one another.

Phase interpolator 2300 can receive control signal 2326 (similar to 2026A of FIG. 20). Based on input 2326, amplifier module 2371 can generate outputs 2372, 2373 respectively controlling the drive strengths of buffers 2362, 2363. The outputs of buffers can be combined to obtain output 2345 (similar to 2045). Inset 2301 shows time waveforms illustrating the behavior of interpolator 2300. With buffer 2362 fully ON and buffer 2363 OFF, output 2345 can have minimum delay, as represented by waveform 2392. With buffer 2362 OFF and buffer 2363 fully ON, output 2345 can have a maximum delay as shown by waveform 2395. By controlling relative drive strengths of buffers 2362, 2363, output 2345 can have any delay between waveforms 2392, 2393. That is, interpolator 2300 can provide a delay adjustment range 2395.

In examples, phase shifter 2016A can provide a wide (coarse) adjustment range 2395, 10-50 ps in some representative die-to-die data links. Phase shifters 2016B-2016C can provide a narrow (fine) adjustment range 2395, 1-5 ps in those example data links. The narrow range can be ⅓ to 1/30 (often about 1/10) the width of the wide tuning range.

Third Example Method

FIG. 24 is a flowchart of a third example method for performing receiver phase calibration. For clarity of illustration, this method is described with reference to FIGS. 20-23. However, the use of apparatus and techniques described in context of FIGS. 20-23 is not a requirement.

At process block 2410, matching signals can be driven on a clock lane and a data lane of a data link. Cycles of the clock lane can define data cycles of respective bits on the data lane in both normal operation and in calibration mode. Process block 2410 can be performed in calibration mode by a transmitter coupled to the data link. The matching signals can be similar to 2244, 2248 of FIG. 22A.

The matching signals from the clock lane and the data lane can be received at a receiver. The received matching signals can be similar to 2044, 2048B of FIG. 20. At process block 2420, a phase offset PO1 between respective signals derived from the matching signals can be measured at the receiver. To illustrate, clocks 2045, 2049B can be derived from matching signals 2044, 2048 via phase shifters 2016A, 2016B; or clocks 2145, 2149 can be derived from matching signals 2244, 2248. Block 2420 can be performed at the receiver in calibration mode. In normal operation mode, the receiver can be configured to latch data received from the data lane at clock edges received from the clock lane. The measured phase offset can be similar to 2165 of FIGS. 21-22.

At block 2430, an adjustable phase shift PH can be controlled until, at PH=PH1, the measured phase offset PO1 matches a target phase offset POT (2175). The adjustable phase shift can be implemented with a phase shifter similar to 2016A-2016C or 2300. At block 2440, the adjustable phase shift PH can be set based on the value PH1. Block 2440 can be performed by a controller similar to 2004A-2004C or by a phase shifter.

Numerous variations and extensions can be implemented within scope of the disclosed technologies. Blocks 2410, 2420, 2430 can be performed in a calibration mode of a data link from respective serializer(s) to deserializer(s) 2058A-2058C. After completion of the method, the data link can be put into an operation mode, with the calibrated phases applied at phase shifter 2016A and, optionally, fine shifters 2016B-2016C. Content data can be transmitted over the data lane (e.g. 2048A-2048C). The data lane can be accompanied by a clock lane carrying a serial clock signal having period To. The matching signals applied in calibration mode at block 2410 can be periodic waveforms having period Tc in a range 0.5×To to 3.0×To. In some examples, Tc approximately equal to 2×To can be used to match the average transition density on data lanes, thereby emulating circuit loading in normal operation. The serial clock can have a cycle of duration Td (which can be Td=To for a single-rate clock, or Td=0.5×To for a double-rate clock). The target phase shift can be in a range 0.3×Td to 0.7×Td for good signal-to-noise ratio.

The respective signals (2145, 2149) can be applied to inputs of an XOR gate (2162) and the output of the XOR gate can be detected (e.g. by comparator 2166). Block 2430 can be performed by comparing a first signal (2165) representing the measured phase offset with a second signal (2175) representing the target phase offset. One or more control signals (2026A-2026C, 2326) can be applied to a phase shifter (2016A-2016C, 2300) to drive the measured phase offset to the target phase offset. The applying one or more control signals can include setting drive strength (2372, 2373) of one or more channels (2362, 2363) of a phase interpolator (2300).

Additional extensions of the third method are shown in FIGS. 25-26. FIG. 25 is a flowchart 2500 of a fine calibration extension. At block 2510, a clock lane of a data link can be calibrated. Block 2510 can set the value of a phase shifter similar to 2016A of FIG. 20, e.g. using the method of FIG. 24 described above. Block 2520 iterates enclosed blocks 2530-2570 over data lanes (e.g. lanes B, C of FIG. 20) other than that used for calibration (e.g. lane A). At block 2530, second matching signals can be driven from a transmitter over a reference lane (2047B) and an instant data lane (2048B). At block 2540, the second matching signals can be received at the receiver and, at block 2550, phase offset PO2 can be measured between signals (2047B, 2049B) derived from the second matching signals. At process block 2560, an adjustable second phase shift (2016B) in the instant data lane can be adjusted until, at phase shift PH2, measured phase offset PO2 matches a target phase offset POT2. At block 2570, the adjustable second phase shift can be set based on the value PH2.

FIG. 26 is a flowchart 2600 illustrating data link operation subsequent to receiver phase calibration. At block 2610, a clock lane can be calibrated. Block 2610 can set the value of a phase shifter similar to 2016A of FIG. 20, e.g. using the method of FIG. 24 described above. At optional block 2620 (shown in dashed outline), one or more data lanes can be calibrated. Block 2620 can set the value of a phase shifter similar to 2016B of FIG. 20, e.g. using the method of FIG. 25 described above. Then, at block 2630, data can be transmitted over the data lane(s) with an accompanying clock on the clock lane.

Still further, embodiments of the disclosed technologies can integrate source clock phase calibration, or associated techniques, as described in context of FIGS. 13-19, with receiver phase calibration, or associated techniques, as described in context of FIGS. 20-26, in any combination.

Example Credit-Based Flow Control

Further examples of the disclosed technologies provide credit-based flow control of multiple data links using a common reverse channel. The data links can deliver content data from a common data source into respective buffers at a common data sink, and sink logic can extract data from the buffers. Because data delivery and data extraction at a buffer can be asynchronous, buffer occupancy can vary. Credits can be used to represent available buffer space: each buffer can have an associated credit count indicating how many buffer locations are available at any time. Moreover, any given data link can have multiple successive data words in flight simultaneously. Various schemes can be implemented to increment and decrement the credit count. Credits, or changes in credits, can be reported back to the data source, enabling the data source to throttle data transmission as the buffer nears or reaches full occupancy.

As a first illustration I1, a buffer with 64 word capacity can receive data from a data link having at most four words in flight at any time. The data link transmitter module can maintain a partner credit counter PCC indicating how many credits it has for the buffer in the partner receiver module. At data link start-up, the buffer can be empty and the data link transmitter module can have all 64 credits, e.g. PCC=64. As the transmitter queues up 12 words for transmission over the data link, it decrements the counter PCC→64−12=52. These words are gradually transmitted and stored in the receiver-side buffer. As sink logic extracts three words from the buffer, the corresponding three credits become available again. The three credits can be reported back to the transmitter module, causing the counter to be updated PCC→52+3=55. This increment can occur before or after all 12 words have reached the receiver-side buffer. In this scheme, counter decrements are handled by the transmitter module, counter increments are handled by the receiver module, and a counter at the receiver module can track credit increments to be reported back to the transmitter. The transmitter can stop additional transmission counter PCC reaches zero.

As a second illustration IL2, the counter at the receiver module can maintain a count BCC of available buffer locations, e.g. credits available to the transmitter. For the same parameters as illustration IL1, BCC=64 initially, which can be echoed back to the transmitter, setting PCC=BCC=64. When 12 words are stored in the receiver buffer, BCC→52. Later, when three words are extracted by sink logic, BCC→55. Each time, BCC is echoed back to the transmitter, successively setting PCC=52, PCC=55. The transmitter module can limit subsequent transmissions based on its latest PCC value. Thus, with PCC=52 and a maximum of four words in flight, the transmitter can limit itself to adding at most 52−4=48 words to a transmit buffer. In this scheme, counter increments and decrements are both handled by the receiver module, and the transmitter can take into account in-flight data. That is, the transmitter can stop additional transmission when its credits reach a threshold of four, because in-flight data may cause the buffer to reach full occupancy. The threshold can be increased to account for latency in the flow control loop, or can be decreased if no content data has been transmitted recently.

For clarity, the flow control examples of FIGS. 27-32 are described in terms of credits which reflect space available within a receive-side buffer. A skilled artisan reading this disclosure will recognize that these techniques can also be implemented with counters reflecting buffer usage, which is complementary to the space available.

In the examples of FIGS. 27-32, multiple forward data links can share one reverse channel for credit reporting. Space required for multiple reverse channels in a medium joining the data source and sink can exceed space required for a single channel, and drive power for multiple reverse channels can exceed that for a single channel. Accordingly, a common reverse channel can provide economies of space and power.

Fifth Example System

Figure 27:
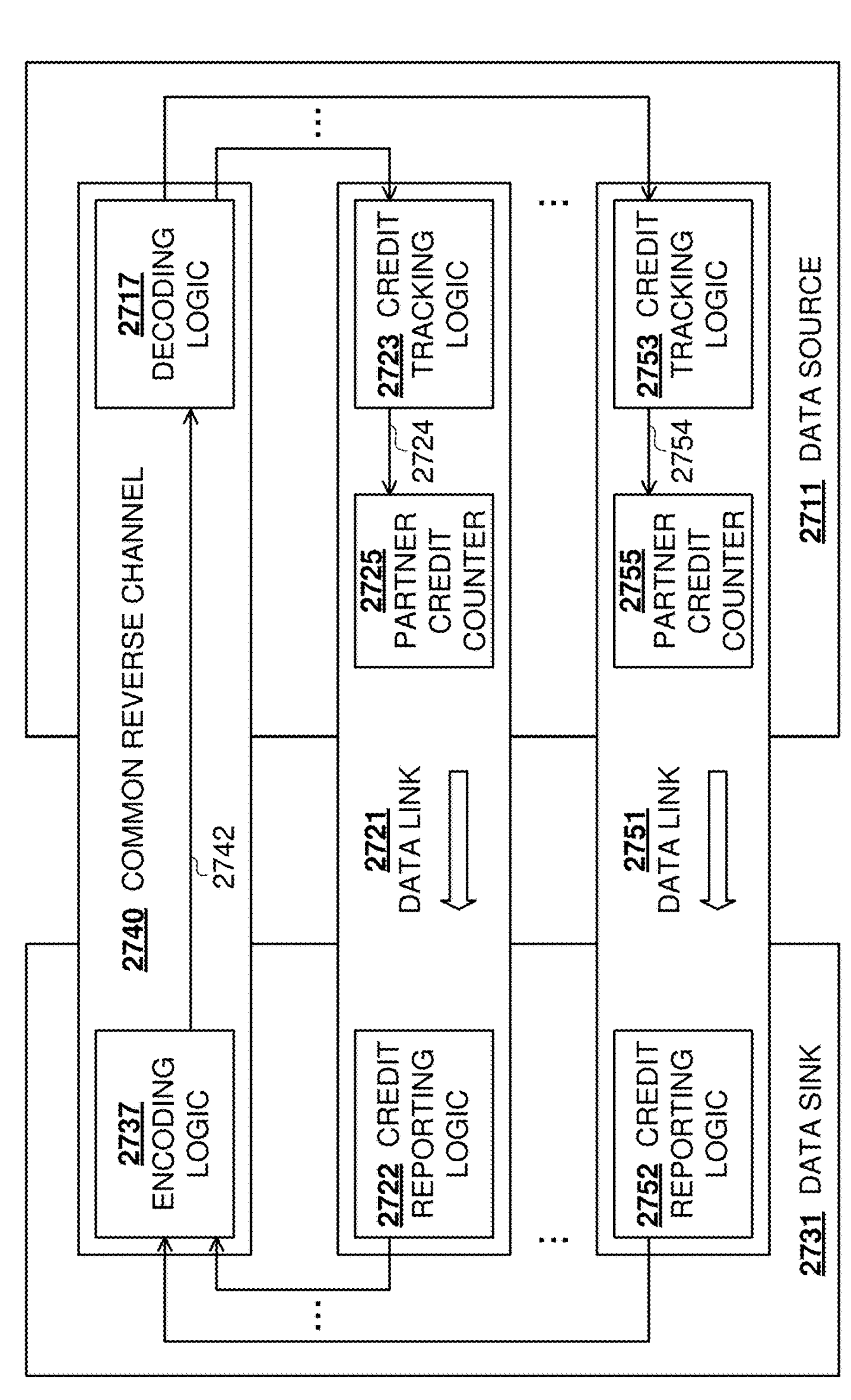
FIG. 27 is a diagram of a fifth example system according to the disclosed technologies, having a common reverse channel shared by multiple data links.

FIG. 27 is a diagram of a fifth example system 2700, in which multiple forward data links implement flow control using a common reverse channel. A plurality of data links 2721 2751 can be configured to transfer data from data source 2711 to data sink 2731. Each data link 2721, 2751 has credit reporting logic 2722, 2752 at data sink 2731. Credit reporting logic 2722, 2752 can generate a credit report (e.g. a word storing a number buffer locations freed up since an immediately preceding credit report) for associated data ink 2721, 2751. Each data link 2721, 2751 also has credit tracking logic 2723, 2753 at data source 2711. Credit tracking logic 2722, 2752 can receive the credit report generated by respective credit reporting logic 2723, 2753 and can update respective partner credit counter 2725, 2755 based on the received credit report, as indicated by arrows 2724, 2754. Data source 2711 can be configured to control data flow over data link 2721, 2751 based on the respective partner credit counter 2725, 2755. To illustrate, data flow can be stopped when partner credit count (e.g. in units of words) is less than or equal to a threshold. The threshold can be implementation dependent, e.g. zero for the illustration IL1, or equal to a maximum number of in-flight data words for illustration IL2.

The credit reports generated by reporting logic 2722, 2752 can be transmitted from data sink 2731 to data source 2711 over common reverse channel 2740, which can include encoding logic 2737 at data sink 2731 and decoding logic 2717 at data source 2711. Encoding logic 2727 can aggregate credit reports from credit reporting logic 2722, 2752 and place the aggregated reports on a reverse link 2742. Decoding logic 2717 can distribute the respective reports, e.g. received over link 2742, to credit tracking logic 2723, 2753.

Numerous variations and extensions can be implemented within scope of the disclosed technologies. Reverse link 2742 can be implemented on a single lane or on multiple lanes.

In some examples, common reverse channel 2740 can be a physical channel dedicated to communication of the credit reports from the data sink to the data source. In other examples, common reverse channel 2740 can be one of multiple logical channels sharing reverse link 2742. The logical channel can include respective fields for the credit reports of data links 2721 2751. Alternatively, the logical channel can include one or two fields shared among the logical channels. In some examples, one field can be shared on a round-robin basis, rotating among data links 2721 . . . 2751 in successive frames on link 2742. In other scenarios, credit updates may occur more frequently on some data links than others. Encoding logic 2737 can queue credit reports received from credit reporting logic 2722, 2752 and transmit one credit report in each frame (when the queue is not empty). This technique can avoid wasting power and bandwidth on credit reports for idle or low-traffic data links, while providing lower-latency service for busy data links. Further aspects of logical channel embodiments are described in context of FIG. 29 or elsewhere herein.

Source 2711 and sink 2731 can be implemented as dice, integrated circuit packages, other computing apparatus, network devices, or other communication apparatus. As discussed for FIGS. 2-3, the flow control components illustrated for data links 2721 . . . 2751 and reverse channel 2740 can also be incorporated into an integrated circuit package, or into a computer. In some examples, an integrated circuit package can incorporate first and second dice coupled by an interposer. System 2700 can be distributed over the first and second dice, with the data source on the first die and the data sink on the second die. Each data link can include a respective transmission bus extending from the data source to the data sink through the interposer. The common reverse channel can include a reverse transmission bus extending from the data sink to the data source through the interposer. In further examples, the integrated circuit package can include another instance of system 2700 with data source on the second die and data sink on the first die, and similar transmission buses connecting the dice through the interposer. Any one or more of the data links can be a serialized data link as described in context of FIG. 1 or FIG. 4.

Figure 28:
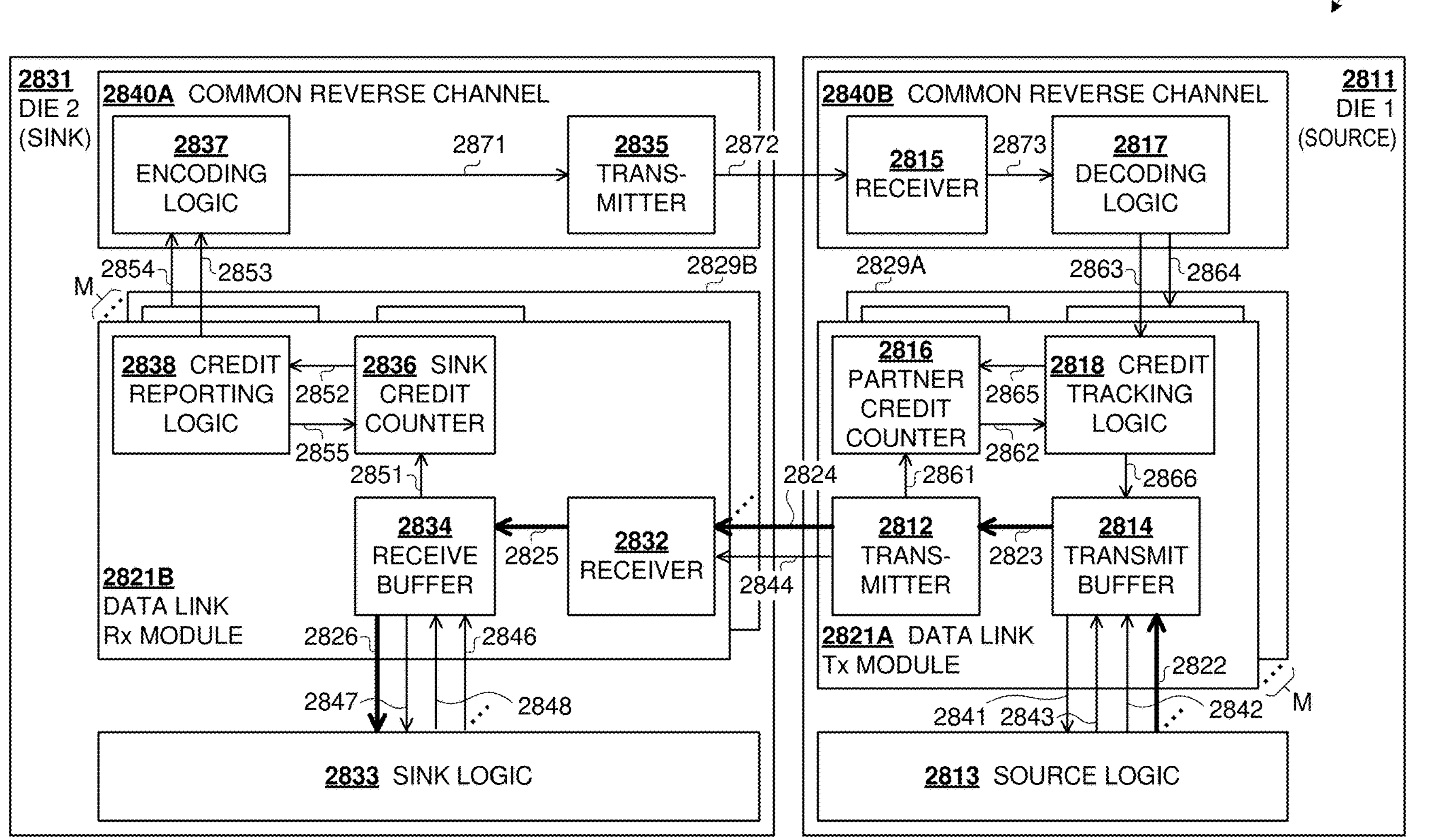
FIG. 28 is a diagram of a sixth example system according to the disclosed technologies, also having a common reverse channel.

Additional extensions and variations of system 2700 are described in context of FIG. 28.

Sixth Example System

FIG. 28 is a diagram of a sixth example system 2800, also implementing a common reverse channel shared by multiple forward data links. System 2800 shares some features with system 2700, and shows some additional features found in some examples of the disclosed technologies. Some entities in FIG. 28 have two disjoint portions on respective dice. Such portions 28*nn*A, 28*nn*B are sometimes referred to collectively as 28*nn* for conciseness.

Die 2811 implements a data source similar 2711 of FIG. 27, and die 2831 implements a data sink similar to 2731. M Data links 2821-2829 straddle dice 2811, 2831, with transmit-side ("Tx") modules 2821A . . . 2829A on source die 2811 and receive-side ("Rx") modules 2821B . . . 2829B on sink die 2831. Source logic 2813 on die 2811 can transfer data to sink logic 2833 over these data links. Common reverse link 2840 also straddles dice 2811, 2831, with transmit-side module 2840A on sink die 2831 and receive-side module 2840B on source die 2811.

The data transmission path for data link 2821 follows bold arrows 2822-2826. Initially, parallel data 2822 can be written to transmit buffer 2814 on edges of parallel clock 2842 when valid signal 2843 is ON. The buffer write can be triggered by ready signal 2841. Queued data can be transferred from transmit buffer 2814 to transmitter 2812 as indicated by arrow 2823, and transmitter 2812 can transmit this data to receiver 2832 on sink die 2831 over a transmission bus. The transmission bus can include one or more data lanes 2824. In a clock-forwarded system, data lane(s) 2824 can be accompanied by a clock lane 2844. A clock signal on clock lane 2844 can define data cycles on data lane(s) 2824. Receiver 2832 can store parallel data words 2825 in receive buffer 2834. Sink logic 2833 can provide ready signal 2848 and clock 2846 to retrieve data 2826 from receive buffer 2834, which can be accompanied by valid signal 2847. Operation of other data links 2829 can be similar.

The description of flow control starts from transmitter-side partner credit counter 2816, and follows illustration IL1 above. Initially, the value PCC of partner credit counter 2816 can be initialized to the size of receive buffer 2834, e.g. PCC=64. As data is transmitted (or queued for transmission) by transmitter 2812, PCC can be decremented via signal 2861. Following illustration IL1, transmission of 12 words can update PCC→52. These 12 words can be stored in receive buffer 2834, and three words can be read out to sink logic 2833. Sink credit counter, initially having value SCC=0, can be incremented as the three words are read out via signal 2851, to SCC=3. In some examples, signal 2851 and valid signal 2847 can be commonly derived, so that counter 2836 can be incremented on valid cycles of data 2846.

As SCC accumulates, counter 2836 can be read out by credit reporting logic 2838 (via signal 2852) for transmission back to die 2811 and transmitter module 2821A. In anticipation of SCC credits being returned to partner credit counter 2816, credit reporting logic 2838 can reset counter 2836 (via reset signal 2855), e.g. to zero. Credit reporting logic can issue a credit report via signal 2853 to encoding logic 2837 of common reverse channel transmission module 2840A. Other data link receiver modules 2829B can issue their own credit reports as indicated by arrow 2854. In some examples, a credit report can be a single data item indicating the SCC value unloaded from counter 2836. In other examples, the credit report can have two fields, one providing SCC and another identifying an issuing data link among the M data links.

Encoding logic 2837 can aggregate credit reports for data links 2821 . . . 2829 into a signal 2871 conveyed to transmitter 2835 for transmission over bus 2872 to receiver 2815 on die 2811, where the aggregated credit report can be conveyed to decoding logic 2817. Decoding logic 2817 can separate individual data links' credit reports and convey them via respective signals 2863-2864 to credit tracking logic 2818 and similar logic for other data links.

Credit tracking logic 2818 can increment partner credit counter 2816 with the SCC=3 credits received from partner receiving module 2821B. As in illustration IL1, this can restore PCC→52+3=55 credits. Credit tracking logic 2818 can also monitor the PCC value via signal 2862 and stop data transfer 2823 out from transmit buffer 2814 via signal 2866.

A given pair of dice can have M≥2 data links 2821 . . . 2829. The description above has focused on data link 2821; other data links can function similarly.

Numerous variations and extensions can be implemented within scope of the disclosed technologies, some of which are described above, in context of FIG. 27, FIG. 29, or elsewhere herein. As discussed above, various schemes can be used for returning credit information from receiver module 2821B to transmitter module 2821A over common reverse channel 2840. Similarly, various signaling schemes can be used for each of data transfers 2822-2826. Various transmission bus implementations can carry data lane(s) 2824 and clock lane 2844. Some implementations can use serialized data lanes with clock-forwarding as described in context of FIG. 1, FIG. 4, or elsewhere herein, while other examples can use parallel buses. Further examples can include a valid channel (logical or physical) or can omit clock 2844. Similar flexibility can apply to bus 2872, which can variously be implemented as a logical channel of a data link (e.g. a data link similar to 2821 or another data link described herein), or as a physical channel. Interconnect between dice 2811, 2831 can be via an interposer, a printed circuit board, a cable, optical fiber, or a combination thereof. In some examples, reverse channel 2840 can be a dedicated physical channel: no data other than (aggregated) credit reports is transferred by transmitter 2835, bus 2872, or receiver 2815.

Example Reverse Channel Signaling

FIG. 29 is a diagram 2900 illustrating an example of signaling in a logical common reverse channel. In this example, credit reports are aggregated into one of several logical channels and transmitted in a reverse data link frame.

Initially, M credit reports 2920 can be received from the credit reporting logic modules (similar to 2722 of FIG. 27 or 2838 of FIG. 28) of respective data links. Credit reports 2920 can be processed by encoding logic 2937 (similar to 2727 or 2837). In this illustration, each credit report 2920 can be placed in a respective field 2927 of aggregated channel data 2947. Channel data 2947 and data of other logical channels (2941 . . . 2946, 2948) can be forwarded to transmitter 2950 (similar to 2835), which can output data frame 2960 for transmission over a reverse data link. In this illustration, aggregated credit report 2947 is placed in header 2961, while other logical channels 2941 . . . 2946, 2948 are placed in payload 2962.

Each channel's data 2941-2948 can be generated by respective channel transmit ("Tx") logic 2931-2938, including encoding logic 2937 for the common reverse channel. The transmitted data frame 2960 can be received at receiver 2970 (similar to 2815). Whereas FIG. 28 only shows processing of a single channel of aggregated credit reports 2873, receiver 2970 is shown distributing data 2941-2948 of all logical channels to respective channel receive ("Rx") logic 2981-2988, including decoding logic 2987 which receives aggregated credit report 2947. Decoding logic 2987 can extract the data links' respective credit reports 2920 and distribute M credit reports 2920 to respective credit tracking logic modules (similar to 2722 or 2818).

FIG. 29 also illustrates power saving features. As illustrated, two channels are idle and there is no channel content data 2946 or 2948 to be transmitted. Thus, channel data 2946, 2948 can be set to null data or to a predetermined pattern. Corresponding transmit logic 2936, 2938 or receive logic 2986, 2988 can be placed in respective low-power states. The idle channels, null data, and low-power logic modules are represented in FIG. 29 with hatched blocks. Thus, power can be saved even while the reverse data link remains active. Reverse link transmitter 2950 or receiver 2970 can be maintained active as long as at least one logical channel of data frame 2960 is active (e.g. not idle).

Numerous variations and extensions can be implemented within scope of the disclosed technologies. In some examples, only some credit reports can be included in a given frame 2960. Selection can be round-robin, based on data links having non-zero credit reports to be returned, or based on another criterion. Thus, an aggregated credit report can be transmitted over multiple frames. The reverse data link can be a serialized data link. The reverse data link can have one data lane or multiple data lanes. Other organization of frame 2960 can be used.

As shown in FIG. 3, two dice 311 can have multiple data links between them, some transferring content data in a forward direction and others transferring content data in a reverse direction. Flow control for such examples can be implemented using a bidirectional data link for credit returns, with a first common credit return channel in a reverse direction providing flow control for the forward data links, and a second common credit return channel in a forward direction providing flow control for the reverse content data links. The bidirectional data link can be time-multiplexed between the two credit return channels.

Fourth Example Method

FIG. 30 is a flowchart 3000 of a fourth example method. In a system having multiple data links from a data source to a data sink, this method returns credits from the data sink to the data source over a common reverse channel. The method can be performed in systems similar to 2700 of FIG. 27 or 2800 of FIG. 28, and can be performed partly at the data sink (2731, 2831) and partly at the data source (2711, 2811).

Process blocks 3010, 3020 can be performed at the data sink. At block 3010, respective credit reports from multiple data links can be aggregated, and at block 3020 the aggregated credit reports can be transmitted over a common reverse channel (2740, 2840) from the data sink to the data source.

Process blocks 3030, 3040 can be performed at the data source. At block 3030, upon receipt of the aggregated credit reports, individual credit reports can be distributed among the data links. To illustrate, credit reports for data links 2721 . . . 2751 can be distributed to respective credit tracking logic modules 2723 . . . 2753. At block 3040, data flow can be controlled over the data links based on the respective credit reports.

Numerous variations and extensions can be implemented within scope of the disclosed technologies, some described in context of FIGS. 31-32, and others described elsewhere herein.

FIG. 31 is a flowchart 3100 of an extension which can be performed at the data sink for at least one data link Li (similar to 2821) prior to block 3010. At block 3110, data can be received over data link Li into a buffer Bi (2834). At block 3120, the data can be delivered (2826) to destination logic (2833) at the data sink. At block 3130, a credit counter (2836) can be updated (2851) based on the data delivery of block 3120. At block 3140, the credit report for data link Li can be generated responsive to the updating, e.g. incorporating an updated value of the credit counter. This credit report can be aggregated with credit reports for other data links at block 3010.

In a variation, the credit report can be generated in response to the credit counter reaching or exceeding a threshold. This can save reverse channel bandwidth for low-traffic data links. In another variation, the credit counter can also be updated responsive to data reception at block 3110, so that the credit counter can reflect the total number of available spaces in the buffer.

FIG. 32 is a flowchart 3200 of an extension of block 3040 for throttling data flow of at least one data link Li, at the data source. At block 3210, a partner credit counter Ci (2725, 2816) can be updated responsive to receipt of the credit report distributed at block 3030. At block 3220, transmission can be stopped in response to the partner credit counter Ci reaching or falling below a threshold T3. Illustratively, the threshold can be zero, or a maximum number of in-flight data words. At block 3230, transmission can subsequently be resumed, responsive to transmit data being available and the partner credit counter being above a threshold T4. Threshold T4 can equal T3, but this is not a requirement.

Additional Serialized Data Link Examples

The following are additional examples of the disclosed technologies for serialized data links.

Example 1 is a system, including: a serial bus comprising N data lanes and a clock lane, where N is a positive integer; N serializers, each coupled to drive a respective data lane of the N data lanes; and N deserializers, each coupled to receive a respective data lane of the N data lanes; wherein each serializer is configured to drive W bits of data on W successive edges of a serial clock which is transmitted over the clock lane; wherein each deserializer is configured to latch the W bits of data on the W successive edges of the serial clock.

Example 2 includes the subject matter Example 1, and further includes: a clock driver coupled: to receive a parallel clock defining parallel clock cycles, each having duration equal to W cycles of the serial clock; to receive a valid signal indicating validity of parallel data provided to the N serializers for each of the parallel clock cycles; and to drive the clock lane; and wherein the clock driver is configured: to hold the clock lane in an idle state free of edges in response to the valid signal being in an OFF state for a first and third parallel clock cycle; and to drive the W successive edges of the serial clock over the clock lane in response to the valid signal being in an ON state for a second parallel clock cycle between the first and third parallel clock cycles.

Example 3 includes the subject matter of Example 2, and further specifies that each of the N serializers is coupled: to receive the valid signal; and to receive parallel data from a respective parallel data bus; wherein the idle state is a first idle state, and each of the N serializers is further configured: to drive the W bits of data, as received on the second parallel clock cycle from the respective parallel data bus, in response to the valid signal being in the ON state; and to place the respective data lane in a second idle state in response to the valid signal being in the OFF state.

Example 4 is an integrated circuit package, including: first and second instances of the system of any one of Examples 1-3 having N equal to N1 and N2 respectively; a first die incorporating the N1 serializers of the first instance and the N2 deserializers of the second instance; a second die incorporating the N1 deserializers of the first instance and the N2 deserializers of the second instance; and an interposer supporting the first and second dice and incorporating the serial transmission buses of the first and second instance.

Example 5 is an integrated circuit package, including: the system of any one of Examples 1-3; a first die incorporating the N serializers; a second die incorporating the N deserializers; and an interposer supporting the first and second dice and incorporating the serial transmission bus.

Example 6 is a computer, including: at least one integrated circuit package according to Example 5; memory storing instructions which, when executed, cause data to be transmitted from logic on the first die to logic on the second die through the system.

Example 7 includes the subject matter of Example 6, and further specifies that the instructions implement a neural network and the data comprises internal signals between units of the neural network.

Example 8 includes the subject matter of any of Examples 1-7, and further specifies that presence of valid data at the deserializer is indicated solely by the W successive clock edges.

Example 9 includes the subject matter of any of Examples 1-8, and further specifies that the W successive clock edges include both rising and falling edges.

Example 10 is an integrated circuit package, including: the system of Example 3, and further specifies that N is at least two; a first die incorporating the N serializers; a second die incorporating the N deserializers; and an interposer supporting the first and second dice and incorporating the serial transmission bus.

Example 11 is a method, including: responsive to each of a plurality W of successive edges of a serial clock, driving a respective bit from a serializer to a deserializer over a transmission bus; forwarding the serial clock to the deserializer over the transmission bus; and responsive to each of the W successive edges of the serial clock, latching the respective bit by a receiving device in the deserializer.

Example 12 includes the subject matter of Example 11, and further includes: receiving a parallel clock defining parallel clock cycles, each having duration equal to W cycles of the serial clock, the parallel clock cycles including, in order, a first, a second, and a third parallel clock cycle; receiving a valid signal having a respective state for each of the parallel clock cycles, wherein the valid signal is in an ON state for the second parallel clock cycle, and in an OFF state for the first and third parallel clock cycles; driving the W successive edges of the serial clock, and the respective bits, in response to the valid signal being in the ON state; and holding the serial clock in an idle state free of additional edges in response to the valid signal being in the OFF state.

Example 13 includes the subject matter of Example 12, and further specifies that the respective bit is driven over a data lane of the transmission bus, the idle state is a first idle state, and the method further comprises: placing the data lane in a second idle state responsive to the valid signal being in the second state.

Example 14 includes the subject matter of any of Examples 11-13, and further includes: delaying the serial clock in between the serializer and the deserializer; wherein propagation delay variation between the delayed serial clock and the driven bits, including dependence on supply voltage variation, meets setup and hold timing constraints at the receiving device in the deserializer.

Example 15 includes the subject matter of any of Examples 11-14, and further specifies that the deserializer and a FIFO are on a common die, a clock domain of the serial clock extends at least from the deserializer to the FIFO, and the method further comprises: responsive to a last edge of the W successive edges, generating one edge of a parallel clock at the deserializer; and by the one edge of the parallel clock, transferring the W latched bits in parallel at one or more successive registers arranged to deliver the W latched bits for storage in the FIFO.

Example 16 is a data transmission system, including: a serial transmission bus comprising N data lanes, a clock lane, and a valid channel, where N is a positive integer; a bus driver coupled to receive: a parallel clock defining parallel clock cycles, each having duration equal to W cycles of a serial clock; and a valid signal indicating, for each of the parallel clock cycles, validity of parallel data to be transmitted over the serial transmission bus; N serializers, each coupled to drive a respective data lane of the N data lanes; N deserializers, each coupled to receive a respective data lane of the N data lanes, and the clock lane; a bus receiver coupled to receive the valid lane and the clock lane of the serial transmission bus; wherein, responsive to the valid signal being ON for P consecutive parallel clock cycles and being OFF for at least a next Q+1 consecutive parallel clock cycles, P and Q being positive integers: the bus driver is configured to: drive P·W cycles of the serial clock over the clock lane with the valid channel ON; drive Q·W cycles of the serial clock over the clock lane with the valid channel OFF; and thereafter, place the clock lane in an idle state; each serializer is configured to drive P·W bits of data on respective cycles of the serial clock; and the bus receiver is configured to: generate, from the (P+Q)·W driven cycles of the serial clock, (P+Q) cycles of an output clock; each deserializer is configured to: latch the P·W bits of data; and drive P words, based on the P·W bits, on respective cycles of the output clock.

Example 17 includes the subject matter of Example 16, and further specifies that: the P words are driven by an output register of the deserializer through a series of one or more additional registers; a clock input of each of the additional registers is delayed by half or one cycle of the output clock relative to an immediately preceding register.

Example 18 includes the subject matter of Example 17, and further specifies that: Q equals 1; the one or more additional registers are one or two additional registers; and the clock input of each of the additional registers is delayed by half cycle of the output clock relative to the immediately preceding register.

Example 19 includes the subject matter of any of Examples 17-18, and further specifies that: the one or more additional registers reach a boundary of a clock domain of the output clock.

Example 20 is an integrated circuit package, including: the data transmission system of any one of Examples 16-19; a first die incorporating the N serializers; a second die incorporating the N deserializers; and an interposer supporting the first and second dice and incorporating the serial transmission bus.

Example 21 includes the subject matter of any of claims 1-20, combined with the subject matter of any of Data Link Transmitter Calibration Examples 1-20, Data Link Receiver Calibration Examples 1-20, or Aggregated Data Link Flow Control Examples 1-20.

Additional Data Link Transmitter Calibration Examples

The following are additional examples of the disclosed technologies for data link transmitter calibration.

Example 1 is a method, including: applying a first parallel clock to drive logic generating parallel data to be transmitted by a group of one or more serializers over respective data lane(s), wherein the group of serializer(s) is controlled in part by a second clock having period equal to a period of the first parallel clock; monitoring a phase relationship between the first parallel clock and the second clock; progressively adjusting a phase of the first parallel clock until, at a particular value of the phase, the monitored phase relationship satisfies a predetermined criterion; and setting the phase of the first parallel clock based on the particular value.

Example 2 includes the subject matter of Example 1, and further specifies that the group of serializer(s) is controlled in part by a serial clock; and the progressively adjusting comprises stepping the phase of the first parallel clock in increments of one, two, three, or four half-periods of the serial clock.

Example 3 includes the subject matter of any of Examples 1-2, and further specifies that the progressively adjusting is a coarse adjusting, and the method further comprises, subsequent to the setting: applying successive fine adjustments to the phase of the first parallel clock until, at a refined value of the phase, the monitored phase relationship satisfies the predetermined criterion; and setting the phase of the first parallel clock based on the refined value.

Example 4 includes the subject matter of any of Examples 1-3, and further specifies that the setting applies a second value, having an offset relative to the particular value, to the phase of the first parallel clock.

Example 5 includes the subject matter of any of Examples 1-4, and further specifies that the monitoring comprises latching the first parallel clock on a transition of the second clock, or latching the second clock on a transition of the first parallel clock.

Example 6 includes the subject matter of any of Examples 1-5, and further specifies that the predetermined criterion is a transition between (a) the first parallel clock leading the second clock and (b) the first parallel clock lagging the second clock.

Example 7 includes the subject matter of any of Examples 1-6, and further includes, subsequent to the setting: latching the parallel data on a clock transition having a predetermined phase relationship with the second clock; and serially transmitting, by the serializer(s), the latched data.

Example 8 includes the subject matter of any of Examples 1-7, and further specifies that the group of one or more serializers is a plurality of serializers.

Example 9 is an apparatus, including: a phase tuner coupled to adjust a phase of a first parallel clock driving logic generating parallel data to be serialized and transmitted by a group of one or more serializers over respective data lane(s) wherein the group of serializer(s) is controlled in part by a second clock having period equal to a period of the first parallel clock; a phase detector coupled to detect a phase relationship between the first parallel clock and the second clock; wherein the phase tuner and the phase detector are coupled to a controller which is configured to: monitor the detected phase relationship; progressively adjust a phase of the first parallel clock until, at a particular value of the phase, the monitored phase relationship satisfies a predetermined criterion; and control the phase tuner to set the phase of the first parallel clock based on the particular value.

Example 10 includes the subject matter of Example 9, and further includes the controller.

Example 11 is a die, including: one or more instances of the apparatus of any one of Examples 9-10; and respectively, for each of the instance(s): the logic; and the group of serializer(s).

Example 12 includes the subject matter of Example 11, and further specifies that the controller coupled to each of the instance(s) is a common controller, and the die further comprises: the common controller.

Example 13 includes the subject matter of Example 12, and further includes: computer-readable memory storing instructions which, when executed by the controller, cause the controller to perform the monitoring, the progressively adjusting, and the controlling acts for each of the instance(s).

Example 14 is an integrated circuit package, including: a first die according to any one of Examples 11-13; one or more receiving dice comprising deserializers configured to receive the serialized data transmitted by the one or more instances over the respective data lane(s); and one or more interposers comprising portions of the respective data lane(s) coupling the first die to the one or more receiving dice.

Example 15 is a computer, including: at least one integrated circuit package according to Example 14; and memory storing instructions which, when executed, cause the serialized data to be transmitted.

Example 16 includes the subject matter of Example 15, and further specifies that the instructions implement a neural network and the data comprises internal signals between units of the neural network.

Example 17 includes the subject matter of any of Examples 9-16, and further specifies that the phase detector comprises a D-type flip-flop receiving the first parallel clock and the second clock at its data and clock inputs.

Example 18 includes the subject matter of any of Examples 9-17, and further specifies that the phase tuner comprises: a multiplexer comprising a plurality of input taps, an output which is the first parallel clock, and a control port by which the phase tuner is controlled to adjust the phase of the first parallel clock; and a chain of delay elements receiving a third clock, with outputs of successive delay elements coupled to successive taps of the plurality of input taps; wherein the third clock and the second clock are derived from a common master clock.

Example 19 includes the subject matter of Example 18, and further specifies that the delay elements are flip-flops clocked by alternating transitions of a fourth clock and a total delay of the chain of delay elements is in a range 0.4-1.1 times the period of the first parallel clock.

Example 20 is one or more computer-readable media storing instructions which, when executed by a controller, cause the controller to perform operations comprising: monitoring a phase relationship between a first parallel clock and a second clock; wherein the first parallel clock is coupled to drive logic generating parallel data to be transmitted by a group of one or more serializers over respective data lane(s); and wherein the group of serializer(s) is controlled in part by a second clock having period equal to a period of the first parallel clock; progressively adjusting a phase of the first parallel clock until, at a particular value of the phase, the monitored phase relationship satisfies a predetermined criterion; and setting the phase of the first parallel clock based on the particular value.

Example 21 includes the subject matter of any of Examples 1-20, combined with the subject matter of any of Serialized Data Link Examples 1-20, Data Link Receiver Calibration Examples 1-20, or Aggregated Data Link Flow Control Examples 1-20.

Additional Data Link Receiver Calibration Examples

The following are additional examples of the disclosed technologies for data link receiver calibration.

Example 1 is a method, including: at a transmitter configured to drive a data lane and a clock lane whose cycles correspond to respective bits on the data lane: driving matching signals on the data lane and the clock lane; at a receiver configured to latch data received on the data lane at edges received on the clock lane: receiving the matching signals; and measuring a phase offset between respective signals derived from the matching signals; controlling an adjustable phase shift in the clock lane until, at a first value of the phase shift, the measured phase offset matches a target phase offset; and setting the adjustable phase shift based on the first value.

Example 2 includes the subject matter of Example 1, and further includes, subsequent to the setting, transmitting content data from the transmitter to the receiver over the data lane.

Example 3 includes the subject matter of any of Examples 1-2, and further specifies that the transmitted content data is accompanied by a clock signal, having a first period, on the clock lane, and the matching signals comprise a periodic waveform having period between 0.5 and 3.0 times the first period.

Example 4 includes the subject matter of any of Examples 1-3, and further specifies that the transmitted content data is accompanied by a clock signal, defining clock cycles of a first duration, on the clock lane, and the target phase offset is 0.3 to 0.7 times the first duration.

Example 5 includes the subject matter of Example 4, and further specifies that the measuring the phase offset comprises: applying the respective signals to inputs of an XOR gate; and detecting an output of the XOR gate.

Example 6 includes the subject matter of any of Examples 1-5, and further specifies that the controlling the adjustable phase shift comprises: comparing a first signal representing the measured phase offset with a second signal representing the target phase offset; and applying one or more control signals to a phase shifter to drive the measured phase shift toward the target phase offset.

Example 7 includes the subject matter of Example 6, and further specifies that the applying one or more control signals comprises setting drive strength on one or more channels of a phase interpolator.

Example 8 includes the subject matter of any of Examples 1-7, and further specifies that the data lane is a first data lane of a plurality of data lanes of a transmission bus, the clock lane is a common clock lane for all the data lanes, the matching signals are first matching signals, the phase offset is a first phase offset, the respective signals are first respective signals, the adjustable phase shift is an adjustable first phase shift, the target phase offset is a first target phase offset, and the method further comprises: for each of the plurality of data lanes other than the first data lane: driving, from the transmitter, second matching signals on a reference lane and the respective data lane; receiving the second matching signals at the receiver; measuring a second phase offset between second respective signals derived from the second matching signals; controlling an adjustable second phase shift in the respective data lane until, at a second value of the second phase shift, the measured second phase offset matches a second target phase offset; and setting the adjustable second phase shift based on the second value.

Example 9 is an apparatus, including: a phase detector coupled to receive signals from a clock lane and a data lane of a transmission bus and configured to output, based on a phase offset between the received signals, a comparison signal in a calibration mode; a phase shifter coupled to receive a control signal derived from the comparison signal and apply a phase shift in the clock lane based on the control signal; wherein the control signal and the applied phase shift drive the phase offset toward a target value.

Example 10 includes the subject matter of Example 9, and further specifies that the received signals are matching signals.

Example 11 includes the subject matter of any of Examples 9-10, and further specifies that the phase detector comprises an XOR gate, a filter, and a comparator, wherein: the received signals are coupled to respective inputs of the XOR gate; an output of the XOR gate is coupled through the filter to a first input of the comparator; a second input of the comparator is coupled to a reference value representing the target value of the phase offset; and the comparison signal is obtained from an output of the comparator.

Example 12 includes the subject matter of any of Examples 9-11, and further specifies that the phase shifter comprises a phase interpolator.

Example 13 includes the subject matter of any of Examples 9-12, and further specifies that the data lane is a first data lane among a plurality of data lanes in the transmission bus, the phase detector is a first phase detector, the received signals are received first signals, the comparison signal is a first comparison signal, the control signal is a first control signal, the calibration mode is a first calibration mode, the phase shifter is a coarse phase shifter, and the apparatus further comprises: for each of the plurality of data lanes other than the first data lane: a respective second phase detector coupled to receive a second signal on the respective data lane and configured to output, based on a phase offset between a reference signal and a third signal derived from the received second signal, a second comparison signal in a second calibration mode; wherein the reference signal is derived from a fourth signal received on the clock lane or on the first data lane; and a respective fine phase shifter coupled to receive a second control signal, derived from the second comparison signal, and apply a second phase shift in the respective data lane based on the second control signal.

Example 14 includes the subject matter of any of Examples 9-13, and further includes a controller coupled to receive the comparison signal and generate the control signal based on the comparison signal.

Example 15 includes the subject matter of any of Examples 9-14, and further includes: a transmission bus comprising the clock lane and the data lane; a serializer configured to drive, over the data lane, calibration data in the calibration mode and content data in a data link mode; a clock driver configured to drive, over the clock lane, a calibration clock in the calibration mode and a serial clock in the data link mode; a deserializer configured to receive the content data and the serial clock; wherein the signals received by the phase detector comprise the calibration clock and the calibration data.

Example 16 is an integrated circuit package, including: the apparatus of Example 15; a controller configured to switch the apparatus between the calibration mode and the data link mode and to generate the control signal from the comparison signal; a first die comprising the serializer, the clock driver, and source logic coupled to provide a first parallel form of the content data to the serializer; and a second die comprising the deserializer, the phase detector, and sink logic coupled to receive a second parallel form of the content data from the deserializer.

Example 17 is a computer, including: at least one integrated circuit package according to Example 16; and memory storing instructions which, when executed, cause the serialized data to be transmitted.

Example 18 includes the subject matter of Example 17, and further specifies that the instructions implement a neural network and the data comprises internal signals between units of the neural network.

Example 19 includes the subject matter of any of Examples 15-18, and further specifies that the phase detector is a first phase detector, the serializer is configured to latch the content data from a parallel bus on a first transition of a first clock, the content data is outputted from source logic on a second transition of a second clock, and the apparatus further comprises; a second phase detector coupled to detect a phase relationship between the first clock and the second clock; and a phase tuner coupled to apply a phase shift to the second clock based on the detected phase relationship; wherein the apparatus is configured to progressively adjust the applied phase shift until the detected phase relationship satisfies a predetermined criterion.

Example 20 is one or more computer-readable media storing instructions which, when executed by a controller, cause the controller to perform operations comprising: in a calibration mode: causing a transmitter to drive matching signals on a data lane and a clock lane; wherein, in an operation mode, the transmitter is configured to drive a data lane and a clock lane whose cycles correspond to respective bits on the data lane measuring a phase offset between respective signals, at a receiver, derived from the matching signals; wherein, in the operation mode, the receiver is configured to latch data received from the data lane at edges received from the clock lane; and controlling an adjustable phase shift in the clock lane until, at a first value of the phase shift, the measured phase offset matches a target phase offset; and for the operation mode: setting the adjustable phase shift based on the first value.

Example 21 includes the subject matter of any of Examples 1-20, combined with the subject matter of any of Serialized Data Link Examples 1-20, Data Link Transmitter Calibration Examples 1-20, or Aggregated Data Link Flow Control Examples 1-20.

Additional Aggregated Data Link Flow Control Examples

The following are additional examples of the disclosed technologies for aggregated data link flow control.

Example 1 is a system, including: for each of two or more data links from a data source to a data sink: sink credit reporting logic at the data sink; and partner credit tracking logic at the data source; and a common reverse channel from the data sink to the data source, comprising: encoding logic at the data sink configured to aggregate respective credit reports from the sink credit reporting logic of each of the data links; and decoding logic at the data source configured to distribute the respective credit reports among the partner credit tracking logic of each of the data links; wherein, at each data link: the partner credit tracking logic is configured to update a partner credit counter based on the respective credit report; and the data source is configured to control data flow over the data link based on the partner credit counter.

Example 2 includes the subject matter of Example 1, and further specifies that the data links are forward data links and the aggregated credit reports are transmitted over one logical channel among a plurality of logical channels within a reverse data link from the data sink to the data source.

Example 3 includes the subject matter of Example 2, and further specifies that the one logical channel comprises respective fields for the respective credit reports of each of the data links.

Example 4 includes the subject matter of any of Examples 2-3, and further includes, for each of the logical channels: channel transmit logic at the data sink; and channel receive logic at the data source; wherein for at least one of the plurality of logical channels, the reverse data link is configured to place the channel transmit logic or the channel receive logic in a low-power state when the respective logical channel is idle.

Example 5 includes the subject matter of Example 4, and further specifies that the reverse data link further comprises: common for the logical channels, a reverse transmitter at the data sink coupled to drive data over the reverse data link from the data sink to the data source; wherein the reverse transmitter is maintained active while at least one of the logical channels is active.

Example 6 includes the subject matter of any of Examples 2-5, and further specifies that the reverse data link is a serialized data link.

Example 7 includes the subject matter of any of Examples 1-6, and further specifies that the common reverse channel is a physical channel dedicated to communication of the credit reports from the data sink to the data source.

Example 8 is an integrated circuit package, including: a first die; a second die; an interposer coupling the first and second dice; and the system of any one of Examples 1-7 distributed over the first and second dice; wherein the data source is on the first die and the data sink is on the second die; wherein each of the data links further comprises a first transmission bus extending from the data source to the data sink through the interposer; and wherein the common reverse channel further comprises a second transmission bus extending from the data sink to the data source through the interposer.

Example 9 includes the subject matter of Example 8, and further specifies that at least one of the data links is a serialized data link.

Example 10 is a computer, including: at least one integrated circuit package according to any one of Examples 8-9; and memory storing instructions which, when executed, cause content data to be transmitted over the data links.

Example 11 includes the subject matter of Example 10, and further specifies that the instructions implement a neural network and the content data comprises internal signals between units of the neural network.

Example 12 is an integrated circuit package, including: a first die; a second die; an interposer coupling the first and second dice; and first and second instances of the system of any one of Examples 1-7, each distributed over the first and second dice; wherein the data source of the first instance is on the first die and the data sink of the first instance is on the second die; wherein the data source of the second instance is on the second die and the data sink of the second instance is on the first die; wherein each of the data links of the first and second instances further comprises a respective first transmission bus extending between the first and second dice through the interposer; and wherein the common reverse channel of the first instance and the common reverse channel of the second instance each further comprises a respective second transmission bus extending between the first and second dice through the interposer.

Example 13 is a method, including: at a data sink: aggregating respective credit reports from a plurality of data links; and transmitting the credit reports over a common reverse channel from the data sink to a data source; and at the data source: distributing the credit reports among the plurality of data links; and controlling data flow over the data links based on the respective credit reports.

Example 14 includes the subject matter of Example 13, and further includes, for at least a given one of the data links: at the data sink: receiving data over the given data link into a buffer; delivering data from the buffer to destination logic at the data sink; updating a credit counter responsive to the delivering data; and generating the respective credit report for the given data link based on the updating.

Example 15 includes the subject matter of Example 14, and further specifies that the respective credit report is generated in response to the credit counter reaching or exceeding a threshold.

Example 16 includes the subject matter of any of Examples 14-15, and further specifies that the credit report for the given data link has a single field, the single field storing a value of the credit counter.

Example 17 includes the subject matter of any of Examples 14-16, and further specifies that the credit report for the given data link comprises: a first field storing a value of the credit counter; and a second field identifying the given data link.

Example 18 includes the subject matter of any of Examples 14-17, and further includes, in conjunction with the generating: resetting the credit counter.

Example 19 includes the subject matter of any of Examples 13-18, and further includes, for at least a given one of the data links, the controlling comprises: updating a partner credit counter responsive to the respective credit report; stopping transmission over the given data link responsive to the partner credit counter reaching or going below a third threshold; and resuming the transmission over the given data link responsive to transmit data being available and the partner credit counter being above a fourth threshold.

Example 20 is a method, including: at a data source coupled to transfer data to a data sink over multiple forward data links: receiving, over a common reverse channel from the data sink, an aggregated credit report comprising individual credit reports of respective one of the forward data links; distributing, from the aggregated credit report, the individual credit reports to the respective forward data links; and controlling data flow over the forward data links based on the individual credit reports.

Example 21 includes the subject matter of any of Examples 1-20, combined with the subject matter of any of Serialized Data Link Examples 1-20, Data Link Transmitter Calibration Examples 1-20, or Data Link Receiver Calibration Examples 1-20.

A Generalized Computer Environment

FIG. 33 illustrates a generalized example of a suitable computing system 3300 in which some described examples, techniques, and technologies for data links can be implemented. The computing system 3300 is not intended to suggest any limitation as to scope of use or functionality of the present disclosure, as the innovations can be implemented in diverse general-purpose or special-purpose computing systems. The computing system 3300 can control data link operation, including calibration or flow control; or can acquire, process, output, or store associated programs or data.

With reference to FIG. 33, computing environment 3310 includes one or more processing units 3322 and memory 3324. In FIG. 33, this basic configuration 3320 is included within a dashed line. Processing unit 3322 can execute computer-executable instructions, such as for control or data transfer as described herein. Processing unit 3322 can be a general-purpose central processing unit (CPU), a processor in an application-specific integrated circuit (ASIC), or any other type of processor. In a multi-processing system, multiple processing units execute computer-executable instructions to increase processing power. Computing environment 3310 can also include a graphics processing unit or co-processing unit 3330. Tangible memory 3324 can be volatile memory (e.g., registers, cache, or RAM), non-volatile memory (e.g., ROM, EEPROM, or flash memory), or some combination thereof, accessible by processing units 3322, 3330. The memory 3324 stores software 3380 implementing one or more innovations described herein, in the form of computer-executable instructions suitable for execution by the processing unit(s) 3322, 3330. The memory 3324 can also store data to be transmitted or received, buffer credits, calibration data, configuration data, other control parameters, or operational data.

A computing system 3310 can have additional features, such as one or more of storage 3340, input devices 3350, output devices 3360, or communication ports 3370. An interconnection mechanism (not shown) such as a bus, controller, or network interconnects the components of the computing environment 3310. Typically, operating system software (not shown) provides an operating environment for other software executing in the computing environment 3310, and coordinates activities of the components of the computing environment 3310.

The tangible storage 3340 can be removable or non-removable, and includes magnetic disks, magnetic tapes or cassettes, CD-ROMs, DVDs, or any other medium which can be used to store information in a non-transitory way and which can be accessed within the computing environment 3310. The storage 3340 stores instructions of the software 3380 (including instructions and/or data) implementing one or more innovations described herein. Storage 3340 can also store traffic data, configuration data, calibration data, or other databases or data structures described herein.

The input device(s) 3350 can be a mechanical, touch-sensing, or proximity-sensing input device such as a keyboard, mouse, pen, touchscreen, or trackball, a voice input device, a scanning device, or another device that provides input to the computing environment 3310. The output device(s) 3360 can be a display, printer, speaker, optical disk writer, or another device that provides output from the computing environment 3310. Input or output can also be communicated to/from a remote device over a network connection, via communication port(s) 3370.

The communication port(s) 3370 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, acoustic, or other carrier.

In some examples, computer system 3300 can also include a computing cloud 3390 in which instructions implementing all or a portion of the disclosed technology are executed. Any combination of memory 3324, storage 3340, and computing cloud 3390 can be used to store software instructions and data of the disclosed technologies.

The present innovations can be described in the general context of computer-executable instructions, such as those included in program modules, being executed in a computing system on a target real or virtual processor. Generally, program modules or components include routines, programs, libraries, objects, classes, components, data structures, etc. that perform particular tasks or implement particular data types. The functionality of the program modules can be combined or split between program modules as desired in various embodiments. Computer-executable instructions for program modules can be executed within a local or distributed computing system.

The terms "computer," "computing system," "computing environment," and "computing device" are used interchangeably herein. Unless the context clearly indicates otherwise, neither term implies any limitation on a type of computing system, computing environment, or computing device. In general, a computing system, computing environment, or computing device can be local or distributed, and can include any combination of special-purpose hardware and/or general-purpose hardware and/or virtualized hardware, together with software implementing the functionality described herein.

General Considerations

As used in this application, the singular forms "a," "an," and "the" include the plural forms unless the context clearly dictates otherwise. Additionally, the terms "includes" and "incorporates" mean "comprises." Further, the term "coupled" encompasses mechanical, electrical, magnetic, optical, as well as other practical ways of coupling or linking items together, and does not exclude the presence of intermediate elements between the coupled items. Furthermore, as used herein, the terms "or" and "and/or" mean any one item or combination of items in the phrase.

The systems, methods, and apparatus described herein should not be construed as being limiting in any way. Instead, this disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed things and methods require that any one or more specific advantages be present or problems be solved. Furthermore, any features or aspects of the disclosed embodiments can be used in various combinations and subcombinations with one another.

Although the operations of some of the disclosed methods are described in a particular, sequential order for convenient presentation, it should be understood that this manner of description encompasses rearrangement, unless a particular ordering is required by specific language set forth below. For example, operations described sequentially can in some cases be rearranged or performed concurrently. Moreover, for the sake of simplicity, the attached figures may not show the various ways in which the disclosed things and methods can be used in conjunction with other things and methods. Additionally, the description sometimes uses terms like "acquire," "adjust," "aggregate," "apply," "buffer," "calibrate," "compare," "configure," "control," "couple," "decode," "detect," "delay," "deliver," "deserialize," "detect," "determine," "distribute," "drive," "encode," "evaluate," "execute," "forward," "generate," "hold," "identify," "idle," "ignore," "implement," "indicate," "interface," "latch," "maintain," "manage," "match," "measure," "operate," "output," "pause," "perform," "place," "process," "produce," "provide," "read," "receive," "report," "reset," "resume," "retrieve," "sample," "select," "serialize," "set," "stop," "store," "throttle," "track," "transfer," "transmit," "tune," "update," and "use" to describe operations performed or controlled by a computer in a computer system. These terms can be high-level descriptions of the actual operations that are performed by a computer or by logic implemented in hardware. The actual operations that correspond to these terms will vary depending on the particular implementation and are readily discernible by one of ordinary skill in the art possessing this disclosure.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods that function in the manner described by such theories of operation.

Some examples may refer to items as "optimal," "lowest," "best," "maximum," "extremum," or the like. It will be appreciated that such descriptions are intended to indicate that a selection among a few or among many alternatives can be made, and such selections need not be lower, better, less, or otherwise preferable to other alternatives not considered.

Any of the disclosed methods can be implemented as computer-executable instructions or a computer program product stored on one or more computer-readable storage media, such as tangible, non-transitory computer-readable storage media, and executed on a computing device (e.g., any available computing device, including tablets, smart phones, or other mobile devices that include computing hardware). Tangible computer-readable storage media are any available tangible media that can be accessed within a computing environment (e.g., one or more optical media discs such as DVD or CD, volatile memory components (such as DRAM or SRAM), or nonvolatile memory components (such as flash memory or hard drives)). By way of example, and with reference to FIG. 33, computer-readable storage media include memory 3324, and storage 3340. The terms computer-readable storage media or computer-readable media do not include signals and carrier waves. In addition, the terms computer-readable storage media or computer-readable media do not include communication ports (e.g., 3370).

Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network, a cloud computing network, or other such network) using one or more network computers.

For clarity, only certain selected aspects of the software-based implementations are described. Other details that are well known in the art are omitted. For example, it should be understood that the disclosed technology is not limited to any specific computer language or program. For instance, aspects of the disclosed technology can be implemented by software written in C, C++, C#, Curl, Dart, Fortran, Java, JavaScript, *Julia*, Lisp, Matlab, Octave, Perl, Python, Qt, R, Ruby, SAS, SPSS, SQL, WebAssembly, any derivatives thereof, or any other suitable programming language, or, in some examples, markup languages such as HTML or XML, or with any combination of suitable languages, libraries, and packages. Likewise, the disclosed technology is not limited to any particular computer or type of hardware. Hard-wired implementations can be implemented using electronic design automation (EDA) tools, with the aid of Verilog or VHDL languages. Certain details of suitable computers, hardware, or digital circuitry are well known and need not be set forth in detail in this disclosure.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, infrared, and optical communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved. The technologies from any example can be combined with the technologies described in any one or more of the other examples.

In view of the many possible embodiments to which the principles of the disclosed subject matter may be applied, it should be recognized that the illustrated embodiments are only preferred examples of the disclosed subject matter and should not be taken as limiting the scope of the claims. Rather, the scope of the claimed subject matter is defined by the following claims. We therefore claim all that comes within the scope of these claims and their equivalents.

We claim:

1. A system comprising:

for each of two or more data links from a data source to a data sink:

sink credit reporting logic at the data sink; and partner credit tracking logic at the data source; and a common reverse channel from the data sink to the data source, comprising:

encoding logic at the data sink configured to aggregate respective credit reports from the sink credit reporting logic of each of the data links; and decoding logic at the data source configured to distribute the respective credit reports among the partner credit tracking logic of each of the data links;

wherein, at each data link:

the partner credit tracking logic is configured to update a partner credit counter based on the respective credit report; and the data source is configured to control data flow over the data link based on the partner credit counter.

2. The system of claim 1, wherein the data links are forward data links and the aggregated credit reports are transmitted over one logical channel among a plurality of logical channels within a reverse data link from the data sink to the data source.

3. The system of claim 2, wherein the one logical channel comprises respective fields for the respective credit reports of each of the data links.

4. The system of claim 2, further comprising, for each of the logical channels:

channel transmit logic at the data sink; and channel receive logic at the data source;

wherein for at least one of the plurality of logical channels, the reverse data link is configured to place the channel transmit logic or the channel receive logic in a low-power state when the respective logical channel is idle.

5. The system of claim 4, wherein the reverse data link further comprises:

common for the logical channels, a reverse transmitter at the data sink coupled to drive data over the reverse data link from the data sink to the data source;

wherein the reverse transmitter is maintained active while at least one of the logical channels is active.

6. The system of claim 2, wherein the reverse data link is a serialized data link.

7. The system of claim 1, wherein the common reverse channel is a physical channel dedicated to communication of the credit reports from the data sink to the data source.

8. An integrated circuit package comprising:

a first die;

a second die;

an interposer coupling the first and second dice; and the system of claim 1 distributed over the first and second dice;

wherein the data source is on the first die and the data sink is on the second die;

wherein each of the data links further comprises a first transmission bus extending from the data source to the data sink through the interposer; and wherein the common reverse channel further comprises a second transmission bus extending from the data sink to the data source through the interposer.

9. The integrated circuit package of claim 8, wherein at least one of the data links is a serialized data link.

10. A computer comprising:

at least one integrated circuit package according to claim 8; and memory storing instructions which, when executed, cause content data to be transmitted over the data links.

11. The computer of claim 10, wherein the instructions implement a neural network and the content data comprises internal signals between units of the neural network.

12. An integrated circuit package comprising:

a first die;

a second die;

an interposer coupling the first and second dice; and first and second instances of the system of claim 1, each distributed over the first and second dice;

wherein the data source of the first instance is on the first die and the data sink of the first instance is on the second die;

wherein the data source of the second instance is on the second die and the data sink of the second instance is on the first die;

wherein each of the data links of the first and second instances further comprises a respective first transmission bus extending between the first and second dice through the interposer; and wherein the common reverse channel of the first instance and the common reverse channel of the second instance each further comprises a respective second transmission bus extending between the first and second dice through the interposer.

13. A method, comprising:

at a data sink:

aggregating respective credit reports from a plurality of data links; and transmitting the credit reports over a common reverse channel from the data sink to a data source; and at the data source:

distributing the credit reports among the plurality of data links; and controlling data flow over the data links based on the respective credit reports.

14. The method of claim 13, further comprising, for at least a given one of the data links:

at the data sink:

receiving data over the given data link into a buffer;

delivering data from the buffer to destination logic at the data sink;

updating a credit counter responsive to the delivering data; and generating the respective credit report for the given data link based on the updating.

15. The method of claim 14, wherein the respective credit report is generated in response to the credit counter reaching or exceeding a threshold.

16. The method of claim 14, wherein the credit report for the given data link has a single field, the single field storing a value of the credit counter.

17. The method of claim 14, wherein the credit report for the given data link comprises: a first field storing a value of the credit counter; and a second field identifying the given data link.

18. The method of claim 14, further comprising, in conjunction with the generating: resetting the credit counter.

19. The method of claim 13, further comprising, for at least a given one of the data links, the controlling comprises:

updating a partner credit counter responsive to the respective credit report;

stopping transmission over the given data link responsive to the partner credit counter reaching or going below a third threshold; and resuming the transmission over the given data link responsive to transmit data being available and the partner credit counter being above a fourth threshold.

20. A method, comprising:

at a data source coupled to transfer data to a data sink over multiple forward data links:

receiving, over a common reverse channel from the data sink, an aggregated credit report comprising individual credit reports of respective ones of the forward data links;

distributing, from the aggregated credit report, the individual credit reports to the respective forward data links; and controlling data flow over the forward data links based on the individual credit reports.

* * * * *